US012787372B2

(12) United States Patent
Simmons et al.

(10) Patent No.: US 12,787,372 B2
(45) Date of Patent: Nov. 3, 2026

(54) QUANTUM PROCESSING SYSTEM

(71) Applicant: Silicon Quantum Computing Pty Limited, Kensington (AU)

(72) Inventors: Michelle Yvonne Simmons, New South Wales (AU); Matthew Gregory House, New South Wales (AU); Samuel Keith Gorman, New South Wales (AU); Mark Richard Hogg, New South Wales (AU)

(73) Assignee: Silicon Quantum Computing Pty Limited, Kensington (AU)

( * ) Notice: Subject to any disclaimer, the term of this patent is extended or adjusted under 35 U.S.C. 154(b) by 539 days.

(21) Appl. No.: 18/251,870

(22) PCT Filed: Nov. 4, 2021

(86) PCT No.: PCT/AU2021/051300

§ 371 (c)(1),
(2) Date: May 4, 2023

(87) PCT Pub. No.: WO2022/094660

PCT Pub. Date: May 12, 2022

(65) Prior Publication Data

US 2024/0016069 A1 Jan. 11, 2024

(30) Foreign Application Priority Data

Nov. 4, 2020 (AU) ................................ 2020904014

(51) Int. Cl.

| | |
|---|---|
| ***H10D 48/00*** | (2025.01) |
| ***B82Y 10/00*** | (2011.01) |
| ***B82Y 40/00*** | (2011.01) |
| ***G06N 10/40*** | (2022.01) |
| ***H10D 30/40*** | (2025.01) |

(52) U.S. Cl.
CPC ......... *H10D 48/3835* (2025.01); *G06N 10/40* (2022.01); *B82Y 10/00* (2013.01); *B82Y 40/00* (2013.01); *H10D 30/402* (2025.01)

(58) Field of Classification Search
CPC ...................................................... G06N 10/40
See application file for complete search history.

(56) References Cited

PUBLICATIONS

Simmons et al Towards the atomic-scale fabrication of a silicon-based solid state quantum computer, Surface Science, vols. 532-535, 2003, pp. 1209-1218, https://doi.org/10.1016/S0039-6028(03)00485-0. (Year: 2003).*
Broome, et al., "High-Fidelity Single-Shot Singlet-Triplet Readout of Precision-Placed Donors in Silicon," Phys. Rev. Lett., No. 119, 2017, 8 pgs.

(Continued)

*Primary Examiner* — Matthew L Reames
(74) *Attorney, Agent, or Firm* — Lee & Hayes, P.C.

(57) ABSTRACT

Aspects of the present disclosure are directed to quantum processing systems that include a plurality of donor atom qubits positioned in a semiconductor substrate. The system also comprises a plurality of control gates configured to control the donor atom qubits. The system further comprises an SLQD charge sensor fabricated on/in the semiconductor substrate. The SLQD charge sensor is configured to sense spin-states of two or more donor atom qubits, which are positioned within a sensing range of the SLQD charge sensor.

20 Claims, 15 Drawing Sheets

(56) References Cited

PUBLICATIONS

House, et al., "High-Sensitivity Charge Detection with a Single-Lead Quantum Dot for Scalable Quantum Computation," Phys. Rev., Applied 6, 2016, 7 pgs.
PCT Search Report & Written Opinion for Application No. PCT/AU2021/051300, mailed on Dec. 22, 2021, 7 pgs.
Pakkiam, et al., "Single-Shot Single-Gate rf Spin Readout in Silicon," Phys. Rev. X 8, 2018, 041032-1-041032-6.
EP 21887907.0 Supplementry Extended European Search Report; Aug. 27, 2024, by the European Patent Office; 10 Pages.
Chanrion et al., Charge Detection in an Array of CMOS Quantum Dots; ARXIV.org, Cornell University Library, Apr. 2, 2020, Ithica, NY, 9 Pages.

* cited by examiner

QUANTUM PROCESSING SYSTEM

TECHNICAL FIELD

Aspects of the present disclosure are related to quantum processing systems, particularly but not exclusively, to quantum processing systems including sensors for sensing qubits.

BACKGROUND

The developments described in this section are known to the inventors. However, unless otherwise indicated, it should not be assumed that any of the developments described in this section qualify as prior art merely by virtue of their inclusion in this section, or that those developments are known to a person of ordinary skill in the art.

Large-scale quantum processing systems hold the promise of a technological revolution, with the prospect of solving problems which are out of reach with classical machines. To date, a number of different structures, materials, and architectures have been proposed to implement quantum bits (or qubits) and corresponding quantum control and processing systems. Before such large-scale quantum computers can be manufactured commercially, a number of hurdles need to be overcome, such as precise measurement of qubit states at any given time in a quantum processing device. Different types of sensors have been proposed in the art for measuring qubit states. Some of these sensors take up a large portion of quantum chip real-estate which complicates the architecture design of a quantum chip for a large-scale quantum computer.

Accordingly, improved quantum processing devices and systems for sensing qubit states are desirable.

SUMMARY

According to a first aspect, the invention provides a quantum processing system, comprising: a plurality of qubits positioned in a semiconductor substrate, each qubit being based on a spin state of a quantum dot embedded in the semiconductor substrate and each quantum dot consisting of one or more donor atoms; a single lead quantum dot (SLQD) charge sensor fabricated on/in the semiconductor substrate; a plurality of control gates configured to control the plurality of qubits; wherein the SLQD charge sensor is configured to sense two or more qubits which are positioned within a sensing range of the SLQD charge sensor.

In an embodiment, the sensing range of the SLQD charge sensor is 300 nanometers or less.

In an embodiment, an optimal inter-qubit distance between two adjacent qubits is 5-45 nanometers.

In an embodiment, each of the plurality of control gates is positioned in a plane that is same as a plane in which the corresponding qubit and the SLQD charge sensor are positioned.

In an embodiment, the plurality of qubits are arranged in a one-dimensional linear array and the SLQD charge sensor is positioned in the vicinity of the center of the one-dimensional linear array for sensing the qubits. The SLQD charge sensor may sense four or more qubits in the one-dimensional linear array. The SLQD charge sensor may sense up to fifty qubits in the one-dimensional linear array.

In an alternative embodiment, the plurality of qubits are arranged in a two-dimensional arrangement and the SLQD charge sensor is placed in the vicinity of center of the two-dimensional arrangement. The SLQD charge sensor may sense up to 200 qubits in the two-dimensional arrangement.

In an embodiment, the SLQD charge sensor senses the spin-states of each qubit using single-shot read out processes.

In an embodiment, the sensing range of the SLQD charge sensor is directly proportional to capacitive coupling between the SLQD and donor-based qubits, and the capacitive coupling is directly proportional to $1/d^{1.5}$ or $1/d^{1.4\pm0.1}$ wherein d is the distance between the SLQD charge sensor and qubit.

In an embodiment, the SLQD charge sensor sequentially reads out the spin-states of the two or more qubits.

In an embodiment, the donor atoms are Phosphorus-31 ($^{31}$P) donor atoms.

In an embodiment, $^{31}$P donor quantum dots are fabricated in silicon using atomic precision hydrogen resist lithography.

According to a second aspect, the invention provides a method of manufacturing a quantum processing system comprising the steps of: providing a plurality of qubits positioned in a semiconductor substrate, each qubit being based on a spin state of a quantum dot embedded in the semiconductor substrate and each quantum dot consisting of one or more donor atoms; providing a single lead quantum dot (SLQD) charge sensor on a semiconductor substrate; providing a plurality of control gates configured to control the plurality of qubits; wherein the SLQD charge sensor is configured to measure two or more qubits which are positioned within a sensing range of the SLQD charge sensor.

BRIEF DESCRIPTION OF DRAWINGS

FIG. 5(*b*) shows a schematic of an operating principle of an SLQD charge sensor;

FIGS. 5(*c*) and 5(*d*) show charge stability diagrams for the top (D1, D2) and bottom (D3, D4) pairs of donor quantum dots, respectively;

FIG. 7(*g*)-7(*h*) show gate scans for quantum dot D4, highlighting the fast tunnel rate that prevented single-shot readout.

FIG. 8(*b*) shows plots for shift in SLQD sensor response $V_M$ as a function of distance d from the center of SLQD sensor; and FIGS. 8(*c*) and 8(*d*) highlight the impact of difference between $d^{1.4\pm0.1}$ scaling and $d^3$ scaling for charge sensing and readout fidelity, respectively.

Figure 1:
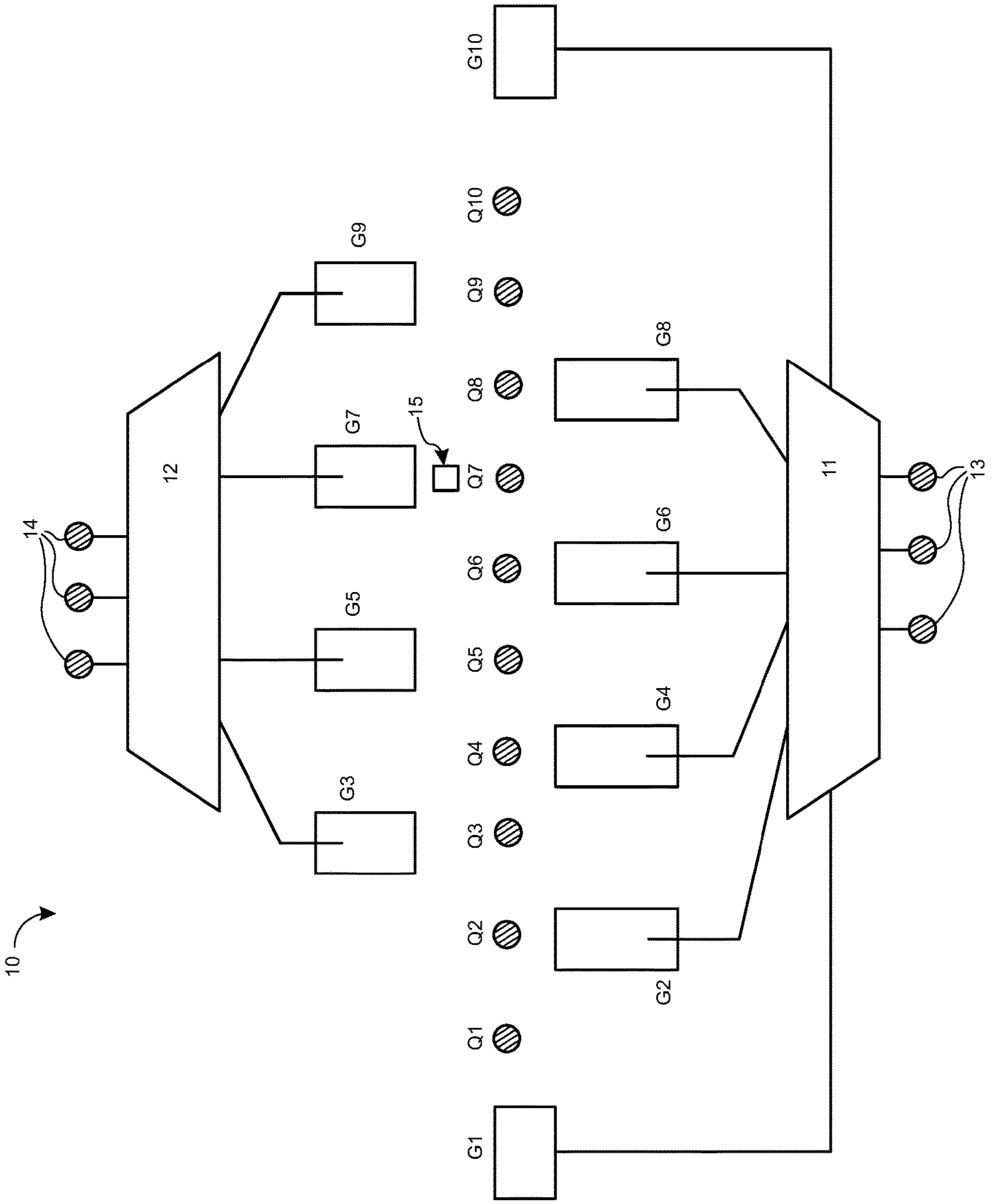
FIG. 1 is a schematic diagram showing a linear array of a plurality of qubits and a single-lead quantum dot (SLQD) charge sensor for sensing the qubits.

While the invention is amenable to various modifications and alternative forms, specific embodiments are shown by way of example in the drawings and are described in detail. It should be understood, however, that the drawings and detailed description are not intended to limit the invention to the particular form disclosed. The intention is to cover all modifications, equivalents, and alternatives falling within the spirit and scope of the present invention as defined by the appended claims.

DETAILED DESCRIPTION

Overview

The spin states of electrons or nuclei in a semiconductor material are good candidates to carry quantum information and act as quantum bits (or qubits) for a quantum computing system. Quantum computation requires three important steps—initialization of qubits, control of qubits, and readout of individual qubits.

Spin readout is an important requirement for fault tolerant quantum computing in semiconductor spin qubits. Spin readout can be performed using single-shot spin readout, meaning that the spin state can be determined with one single iteration of the readout sequence. Single-shot readout is necessary for quantum error correction and readout at the end of a computation, and must be performed with high reliability and precision.

Speed of measurement is an important consideration in quantum processing systems because qubits typically maintain coherence for short periods of time (typically a few hundred microseconds). Single-shot spin readout is typically performed by mapping the spin state of the qubit onto a charge state (i.e. spin-to-charge conversion), which can then be detected using a nearby charge sensor such as a single-electron transistor (SET), quantum point contact (QPC), or tunnel junction. A SET offers good sensitivity, but it is complex, occupies large space and requires at least three electrical contacts to operate: source, drain, and gate which require a significant geometric footprint on the quantum computing chip. Components with the smallest possible footprint are desirable to minimize this for future development of complex and scalable quantum computers comprising hundreds, thousands or millions of qubits.

To overcome some of these issues, dispersive (or gate-based) sensors are growing in popularity as they reduce the device complexity and geometric footprint required to perform spin readout. In contrast to SETs, dispersive sensors integrate qubit readout capability into existing control leads on the device chip. This eliminates the need for additional proximal charge sensors.

Recent advances have demonstrated single-shot readout of singlet and triplet states using direct dispersive sensors. One sensing strategy is to use the dispersive sensor to measure the susceptibility of a single-electron tunnelling at radio frequencies, which requires only one terminal to distinguish singlet and triplet spin states on double quantum dots by Pauli blockade, so-called "gate sensing". One of the drawbacks of this "gate sensing" technique is that readout cannot be performed directly in the "single-spin basis". In other words, the gate sensing technique cannot directly readout a single electron/nuclear spin because it induces the electron to tunnel back and forth to a reservoir, destroying the spin state before it can be resolved.

Present Disclosure

A different type of charge sensor known as single-lead quantum dot (SLQD) charge sensor can be used for electron spin readout. However, to date, SLQDs have not been used for single shot readout in the single-spin basis. SLQDs have high sensitivity, require minimal wiring (i.e., a single lead so they occupy small space) and have a significantly smaller geometric footprint in comparison to SETs. Therefore, SLQD charge sensors are good candidates for electron spin measurements in scalable quantum-computing architectures.

The inventors have found that the small size of SLQDs is not a sufficient advantage for scalable quantum computers. The overall footprint of the charge sensors required for measuring spin states of the qubits in a scalable quantum computing chip also needs to be minimised.

An SLQD charge sensor can only effectively measure the spin state of a qubit within a pre-defined qubit-sensor distance d. This qubit sensor distance d is dependent on the capacitive charge coupling between the sensor and the charge (i.e., the charge corresponding to spin state of the qubit). In free space, the capacitive coupling (or capacitance) between two charges is inversely proportional to the distance between the two charges (i.e., 1/d, where d is the distance between the two charges). However, this scaling becomes $1/d^3$ for charges located underneath a large metal plane due to formation of a dipole. This is the case for accumulation-mode gate-defined devices, such as un-doped SiGe hetero-structure devices and planar Metal-oxide semiconductor (MOS) devices, as these devices require metal accumulation gates for their operation. In a linear array of gate-defined quantum dots, the capacitive coupling scales as a function of $1/d^3$, meaning that the capacitive coupling weakens very rapidly as a function of qubit-sensor distance. In other words, the sensing range of an SLQD in these devices is very short and therefore, a large number of SLQD sensors is required for a large-scale gate-defined device having multiple qubits.

Furthermore the inventors have found that, in atomically defined donor based qubit devices, the trapping potential for both qubits and sensors is defined naturally by the donor potential, eliminating the need for metal accumulation gates and resulting in extremely low gate densities. Therefore, atomically defined qubit devices, such as donor qubit devices, require less metal accumulation above and below the plane of the qubits. Due to this, the capacitive coupling between the SLQD charge sensor and the qubit scales as a function of sensor-qubit distance d and approximately follows a $1/d^{1.5}$ or $1/d^{1.4\pm0.1}$ dependence. Therefore, the SLQD has a larger sensing range for measuring spin-states of the qubits when used in atomically defined donor qubit devices. This reduces the number of SLQD sensors per qubit and hence reduces the overall sensor footprint on a large-scale quantum computing device comprising multiple qubits, providing a remarkable advantage for large-scale quantum computing devices in which 'real-estate' is generally a very valuable resource.

Furthermore, SLQD charge sensors require a single lead (in comparison to other sensors requiring multiple leads). This reduces the number of electrical contacts required on the quantum chip, thereby minimising the sensor footprint and simplifying the geometrical layout of a potential quantum computer.

In this way, SLQD charge sensors with atomically defined donor qubits provide a small sensor footprint achieved through both a) reducing the physical size of the sensor footprint by replacing SETs with SLQDs, and b) reducing the number of SLQD sensors per qubit due to increased sensing range of the SLQD sensors in such devices. Furthermore, the donor qubit devices can be precisely fabricated/engineered to have higher qubit density, and the number of SLQD charge sensors can be placed more sparsely among the qubits. Therefore, such systems may be suitable for realising large-scale quantum computing devices.

Embodiments of the present disclosure are directed to new and inventive donor-based quantum computing systems that include one or more SLQD charge sensors, each sensing a plurality of qubits.

In particular, the present disclosure provides a quantum processing system comprising a plurality of donor atom qubits positioned in a semiconductor substrate. The system also comprises a plurality of control gates. The plurality of control gates are configured to control the donor atom qubits. The system further comprises an SLQD charge sensor fabricated on/in the semiconductor substrate. The SLQD charge sensor is configured to sense spin-states of two or more donor atom qubits, which are positioned within a sensing range of the SLQD charge sensor.

For example, FIG. 5(*a*) shows a schematic of an all-epitaxial donor-based quantum processing system 50. The system 50 comprises four donor atom qubits D1-D4. However, this system can be designed to comprise tens, hundreds, thousands or millions of dopant atom (i.e. donor atom or acceptor atom) qubits. In one embodiment, the dopant atom qubits may be encoded in the spin of an electron or hole associated with a dopant atom. In an example, a qubit may be encoded in the spin of an electron associated with a Phosphorus-31 ($^{31}$P) donor atom. In another embodiment, the qubit may be encoded in the spin of an electron that is provided in a $^{31}$P donor quantum dot fabricated in a semiconductor substrate.

In the example shown in FIG. 5(*a*), the qubits D1-D4 are formed by confining electrons and using the spins of these electrons to carry information. R1 and R2 serve as electron reservoirs for qubits D1, D2 and D3, D4, respectively, as well as providing electrostatic tuning of the donor potentials.

The system 50 also includes an SLQD charge sensor 52 having a lead 54. The lead 54 may be used to load electrons onto the charge sensor 52. The SLQD charge sensor 52 is provided for sensing the spin-states of qubits D1-D4, which are positioned within its sensing range. In particular, the SLQD charge sensor 52 performs single-shot spin readout via spin to charge conversion technique.

The system 50 further includes conductive control gates G1-G4, each of the conductive control gates G1-G4 is for controlling qubits D1-D4. Although four gates are shown in this example, this may not be necessary. In other cases, fewer or more gates may be used to control the qubits D1-D4.

The capacitive coupling between the charge sensor 52 and each of the electrons confined in the donor quantum dots scales as a function of sensor-qubit distance d and can follow a $1/d^{1.5\pm0.1}$ dependence. All the four qubits D1-D4 are within the sensing range of the SLQD sensor 52 and therefore their charge states can be sensed by the single SLQD sensor 52.

The following sections describe various architectures for positioning qubits and one or more SLQD charge sensors such that a large number of qubits can be efficiently sensed.

Linear Architecture

FIG. 1 shows an example qubit architecture according to aspects of the present disclosure. In this architecture, qubits (in the form of donor atoms) are arranged in a linear array. The present example illustrates an array of 10 qubits Q1-Q10.

Qubits in the linear array are controlled by control gates G1-G10. An SLQD sensor 15 is placed near the center of the linear array of qubits and is provided to detect the spin-states of qubits Q1-Q10. In this figure, only 10 qubits (and corresponding 10 control gates G1-G10) are shown for the sake of simplicity, however, a plurality of qubits (i.e., fewer or more than 10 qubits) may be positioned in this linear array, depending on the inter-qubit distance. The spin-states of the plurality of qubits in the linear array may be read out using the single SLQD sensor 15 if the qubits are spatially arranged in a manner that they lie within the sensing range d of the SLQD sensor 15.

Each of the plurality of control gates G1-G10 is positioned in a plane that is same as a plane in which the corresponding donor atom qubit and the SLQD charge sensor 15 are positioned. In an embodiment, the SLQD charge sensor 15 may sense two or more qubits in the one-dimensional linear array. Alternatively, the SLQD charge sensor 15 may sense four or more qubits in the one-dimensional linear array. The number of qubits that can be sensed by the SLQD charge sensor 15 depends on the inter-qubit distance and the architecture of the quantum processing system. For example, for a system architecture in which inter-qubit distance is in the range of 2-50 nanometers (nm), preferably 5-45 nm, and more preferably, 8-15 nm. The sensing range is approximately 300 nm, the SLQD charge sensor may sense up to fifty qubits in the one-dimensional linear array (i.e., 25 qubits on each side of the SLQD charge sensor 15). The SLQD charge sensor of such a system may achieve very high-fidelity qubit readouts up to 99% or more.

Gates G1-G10 are controlled by control units 11 and 12 which may be connected via leads 13 and 14 to realise a central control of all the gates G1-G10. For example, gates G1-G10 may be connected to a multi-channel precision voltage source controlled by a central computing/processing system.

In an alternative architecture, the qubits may be positioned in a matrix, where individual rows of the matrix are sensed by their corresponding SLQDs.

Two-Dimensional Unit Cell Architectures

Figure 2:
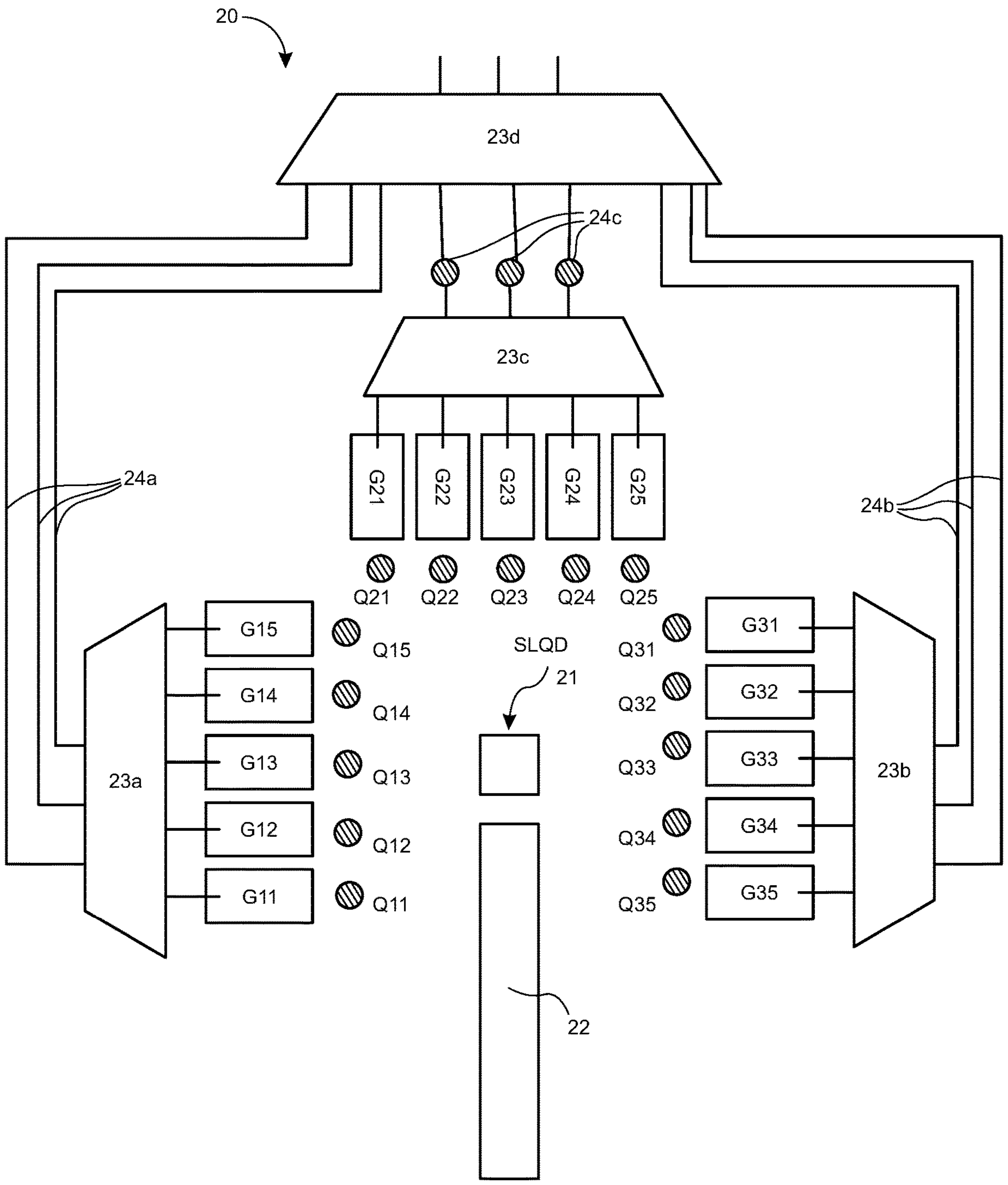
FIG. 2 is a schematic diagram of a quantum processing device comprising a plurality of qubits arranged in a two-dimensional planar arrangement and an SLQD charge sensor for sensing the qubits.
Figure 3:
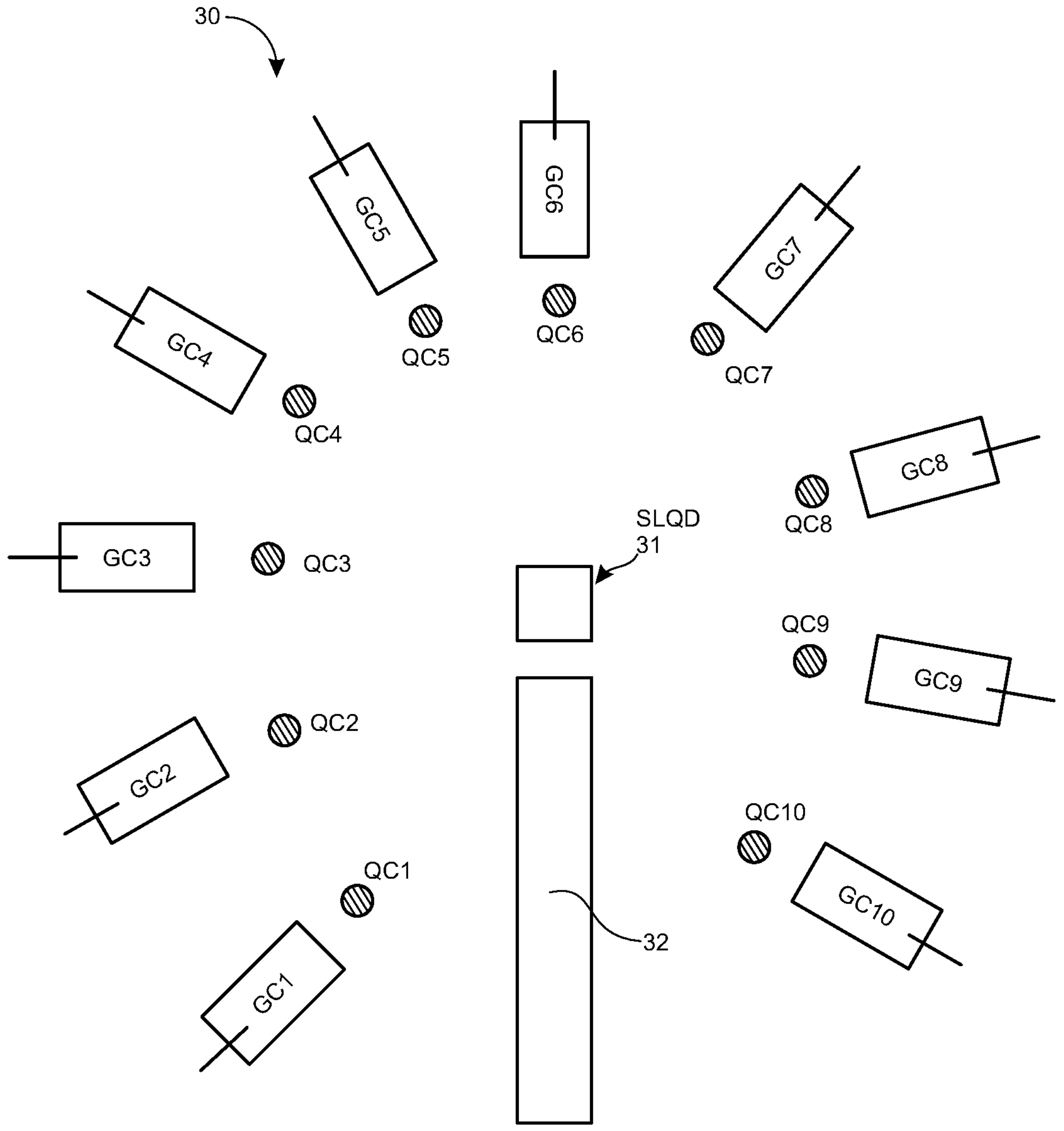
FIG. 3 shows a schematic diagram of a quantum processing device comprising a plurality of qubits arranged in a two-dimensional ring-shaped arrangement and an SLQD charge sensor for sensing the qubits in the ring-shaped arrangement.
Figure 4:
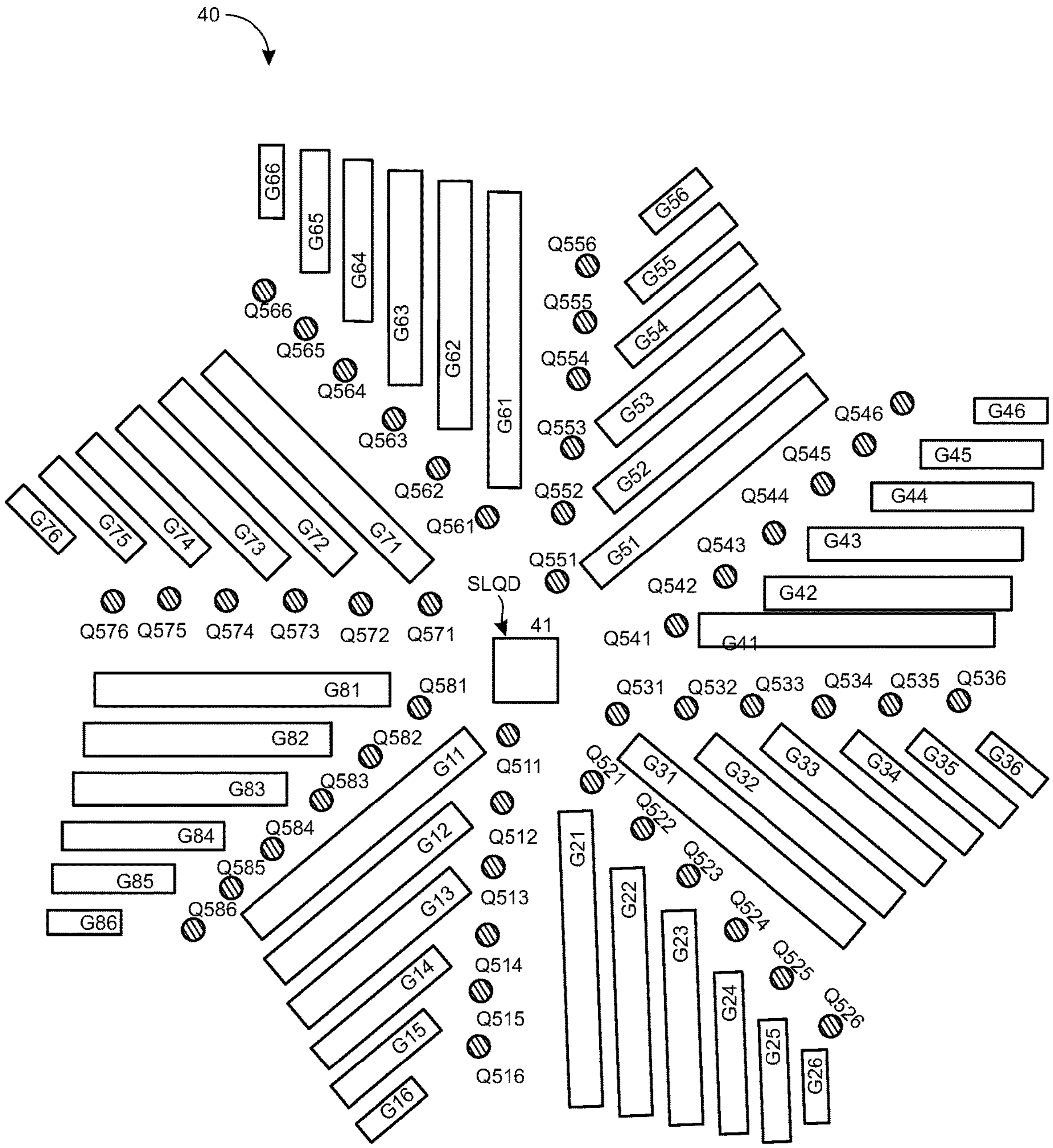
FIG. 4 shows a schematic diagram of a quantum processing device comprising a plurality of qubits arranged in a two-dimensional octagonal arrangement and an SLQD charge sensor for sensing the qubits in the octagonal arrangement.

FIGS. 2-4 show examples of two-dimensional unit cell architectures for a donor-based quantum processing device. FIG. 2 shows a two-dimensional architecture comprising three linear arrays comprising donor atom qubits Q11-Q15, Q21-Q25 and Q31-Q35, respectively. In this two-dimensional arrangement the number of qubits shown is exemplary and this number can be varied. Control gates control the donor qubits. The two-dimensional architecture of FIG. 2 includes control gates G11-G15, G21-G25 and G31-G35 that are provided to control the arrays of donor atom qubits. An SLQD charge sensor 21 is near the center of the two-dimensional arrangement of qubits in these three qubit arrays. A single-lead 22 is provided for loading electrons onto SLQD charge sensor 21. Gates G11-G15, G21-G25 and G31-G35 are controlled by control units 23*a*, 23*b*, 23*c* respectively, which are connected to a common unit 23*d* via leads 24*a*, 24*b* and 24*c*.

FIG. 3 shows a further embodiment of the present disclosure in which a two-dimensional ring-shaped arrangement of donor atom qubits is shown. Donor qubits QC1-QC10 are arranged in a ring-shaped architecture and each of these qubits is controlled by its corresponding control gate GC1-GC10. In this ring-shaped arrangement, the number of qubits shown is exemplary and this number can be varied. An SLQD charge sensor 31 is positioned approximately at the center of the ring-shaped arrangement of donor qubits. A single-lead 32 is provided for loading electrons onto the SLQD charge sensor 31. Gates GC1-GC10 may be controlled by a common control unit as discussed for arrangements shown in FIGS. 1-2.

FIG. 4 shows a further embodiment of the present disclosure in which a two-dimensional octagonal arrangement having 8 equidistant arms of donor qubits is shown. Each arm of the octagon comprises multiple donor qubits. In this embodiment, the first arm comprises donor qubits Q511-Q516, the second arm comprises donor qubits Q521-Q526, and the third arm comprises donor qubits Q531-Q536, and so on. In this two-dimensional arrangement, the number of qubits shown is exemplary and this number can be varied. The donor qubits are controlled by control gates. FIG. 5 illustrates multiple control gates for this. For example, the first arm comprises control gates G11-G16 for controlling donor qubits Q511-Q516, and the second arm comprises control gates G21-G26 for controlling donor qubits Q521-Q526, and so on. An SLQD charge sensor 41 is positioned approximately at the center of this arrangement for sensing the donor qubits. A single-lead (not shown in FIG. 4) is provided for loading electrons onto the SLQD charge sensor 41.

In the above-mentioned two-dimensional architectures of FIGS. 2-4, the SLQD charge sensor 21, 31 or 41 may sense two or more qubits positioned within its sensing range. Alternatively, the SLQD charge sensor 21, 31 or 41 may sense four or more qubits positioned within its sensing range in the two-dimensional unit cell. In a further example, the system architecture in which inter-qubit distance is in the range of 5-15 nanometers (nm), and the sensing range is approximately 300 nm in a linear direction, the SLQD charge sensor may sense up to fifty qubits in each linear array of qubits (25 qubits in each direction of the linear array). This allows the SLQD charge sensor 21 in FIG. 2 to read out up to 150 donor qubits or less. Similarly, in FIG. 3, the SLQD charge sensor 31 may read out all the donor qubits if these are positioned within the sensing range of SLQD 31. Further, the SLQD charge sensor 41 in FIG. 4 may read out up to 200 donor qubits or less (25 qubits in each arm of the octagonal architecture).

Architecture of a Prototype Quantum Processing Device and Operation of the SLQD Charge Sensor As discussed above, FIG. 5*a* shows a schematic image of an all-epitaxial donor-based quantum processing system 50. This system may be fabricated using a scanning tunnelling microscope (STM) to perform atomic precision hydrogen resist lithography on a silicon substrate. During the fabrication, the regions inside the dotted white lines have been selectively desorbed of hydrogen and define the lithographic pattern of the device. The device is heavily doped with phosphorus inside these regions, which act as metallic conductors when cooled to mK temperatures. The structure is then overgrown with an epitaxial layer of silicon, and aluminium ohmic contacts are made to the buried device. The device is bonded to a printed circuit board (PCB) to deliver high-frequency signals and DC voltages, then the device is mounted to the cold finger of a dilution refrigerator with approximately 80 mK base temperature.

Sites D1, D2, D3 and D4 indicate regions where a small number of phosphorus donors are incorporated. Based on STM images and electrically measured charging energies, it is estimated that the number of donors to be 2 for D1, 3 for D2, 3 for D3 and 1 for D4. Conductive control gates G1 and G2 are used for readout pulse sequences on quantum dots D1 and D2, and G3 and G4 serve the same purpose for quantum dots D3 and D4. In addition to single-shot spin-readout, charge sensor 52 can also be used for determining the electron occupation of the donor dots D1-D4.

A schematic of the operating principle of the SLQD sensor is shown in FIG. 5(*b*). The charge sensor 52 comprises a quantum dot that is tunnel coupled to the single lead (L1). When an AC excitation is applied to L1, single-electron tunneling can occur when the Fermi energy is aligned with an available charge state on the sensor's quantum dot. This causes a change in the reflected signal $Rf_{out}$ which can be measured with standard homodyne techniques. A change in the electrostatic environment causes the SLQD response to shift, allowing operation as a charge sensor. When the potential of the SLQD sensor is aligned with the Fermi energy of single lead 54, electron tunnelling between the SLQD 52 and single lead L1 54 becomes possible. Applying an AC excitation to L1 causes an AC single-electron current to flow between the quantum dot and the lead L1, which looks like an extra capacitance (the quantum capacitance) in the circuit. By embedding the SLQD sensor in an LC resonator, this extra capacitance causes a change in the reflected signal that can be detected by monitoring the phase and amplitude of a signal reflected from L1. No DC current can flow through the SLQD during normal operation. A NbTiN superconducting spiral inductor 51 may be used as the resonator, with a resonance frequency of approximately 130 MHz and a loaded quality factor of approximately 400 when bonded to L1. An AC signal is first attenuated before being applied to L1, with the reflected signal being separated to the output chain using a directional coupler 52, before amplification and measurement using a standard homodyne setup. A change in the charge environment in the vicinity of the SLQD causes the dispersively measured Coulomb peak 53 to shift, providing the contrast for charge sensing.

FIG. 5(*c*) shows a charge stability diagram for the top pair of donor quantum dots (D1, D2) for sweeping voltages $V_{L1}$ (voltage at single lead L1) and $V_{R1}$ (voltage at reservoir R1).

This diagram demonstrates the ability of the SLQD sensor 52 to characterise the charge occupation of donor quantum dots D1-D2. The periodic diagonal lines 55 in the diagram are Coulomb-like peaks from the SLQD sensor 52, and donor charge transitions are observed as breaks (56, 57) in the labelled lines overlaying the SLQD transition lines. The inset 59 shows an example break in the SLQD transition lines with donor charge transitions. The overlaid dotted lines indicate D1 charge transitions and the overlaid solid lines indicate D2 charge transitions, as labelled. Sweeping R1 to negative voltages adds electrons to quantum dots D1 and D2. In contrast, gates G1-G4 are only capacitively coupled to the quantum dots (not tunnel-coupled) and sweeping gates G1-G4 to negative voltages typically remove electrons from the corresponding quantum dots D1-D2, respectively.

Figure 5A:
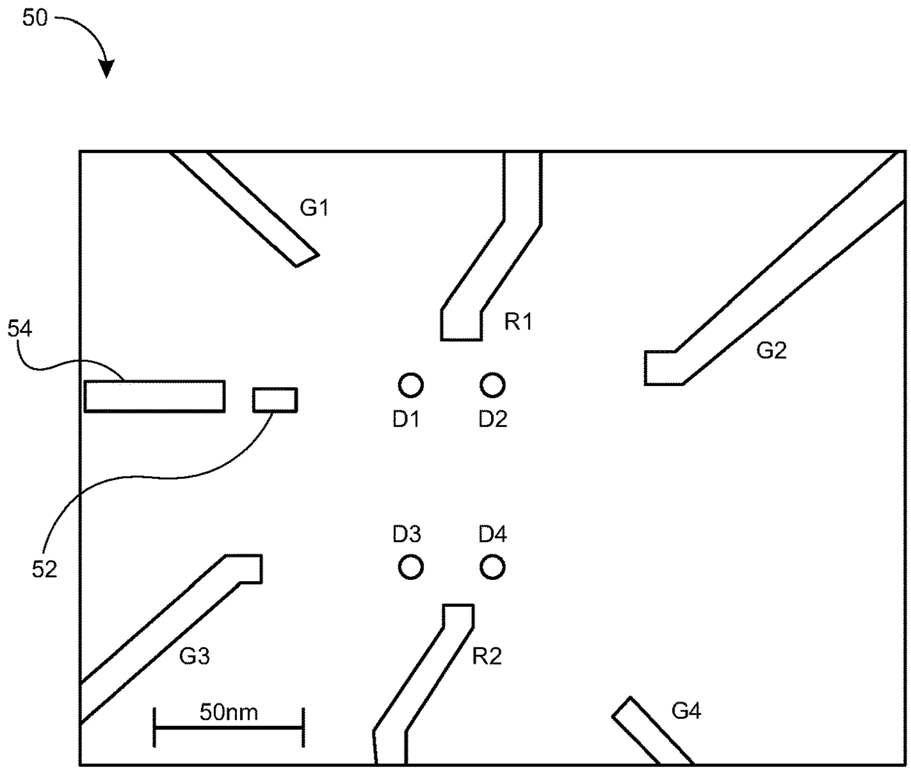
FIG. 5(*a*) shows a schematic image of an all-epitaxial donor-based quantum processing device.
Figure 5B:
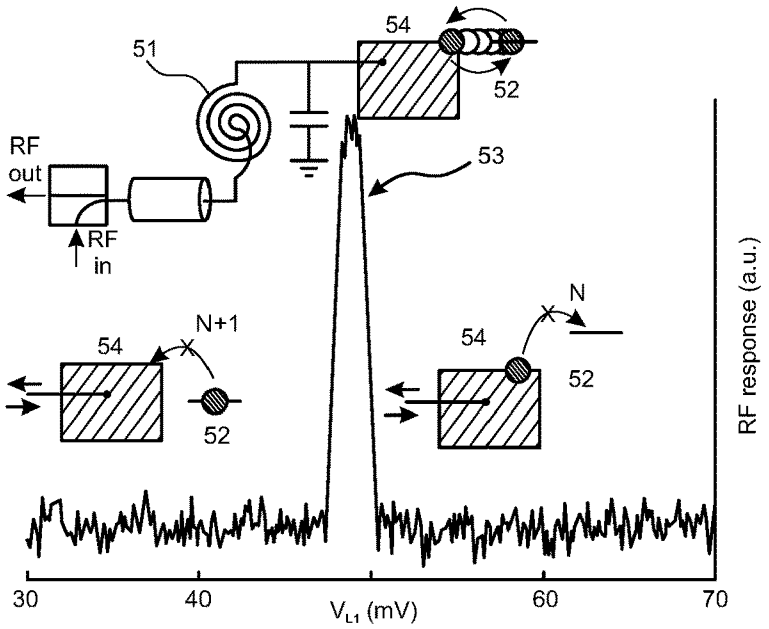
Figure 5C:
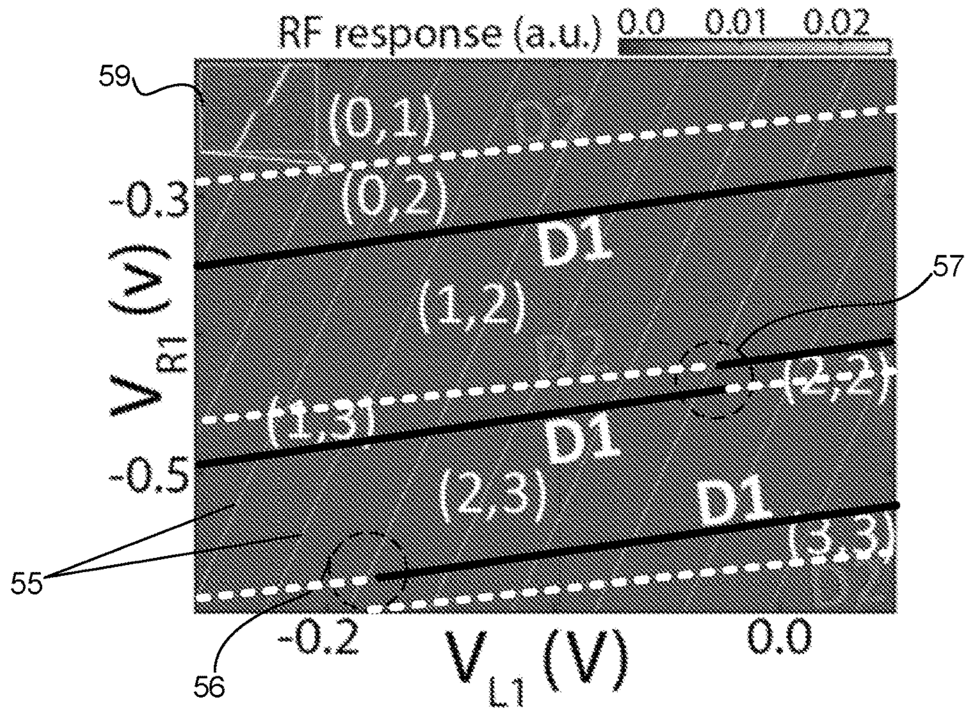
Figure 5D:
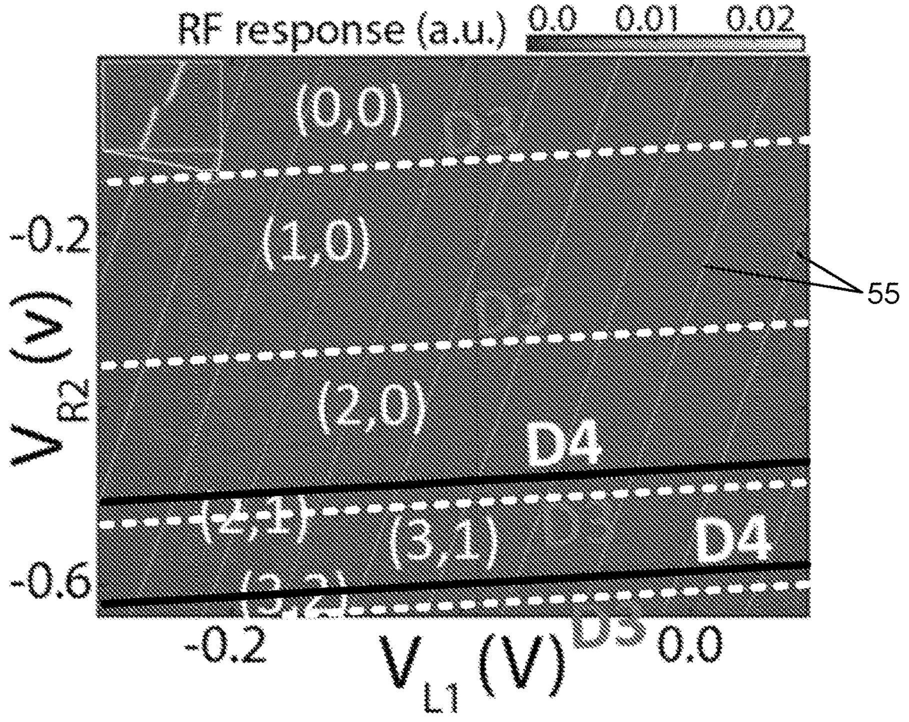
Figure 6A:
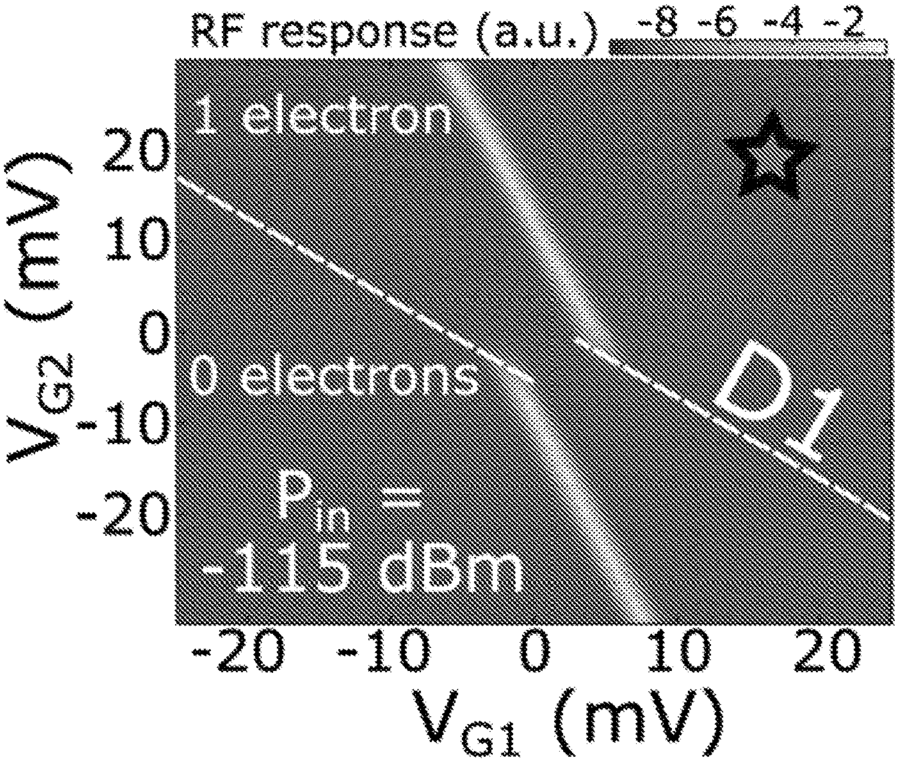
FIGS. 6(*a*)-6(*e*) show charge sensing response of an SLQD charge sensor for the first charge transition of a quantum dot as a function of gate voltages and input power levels.
Figure 6B:
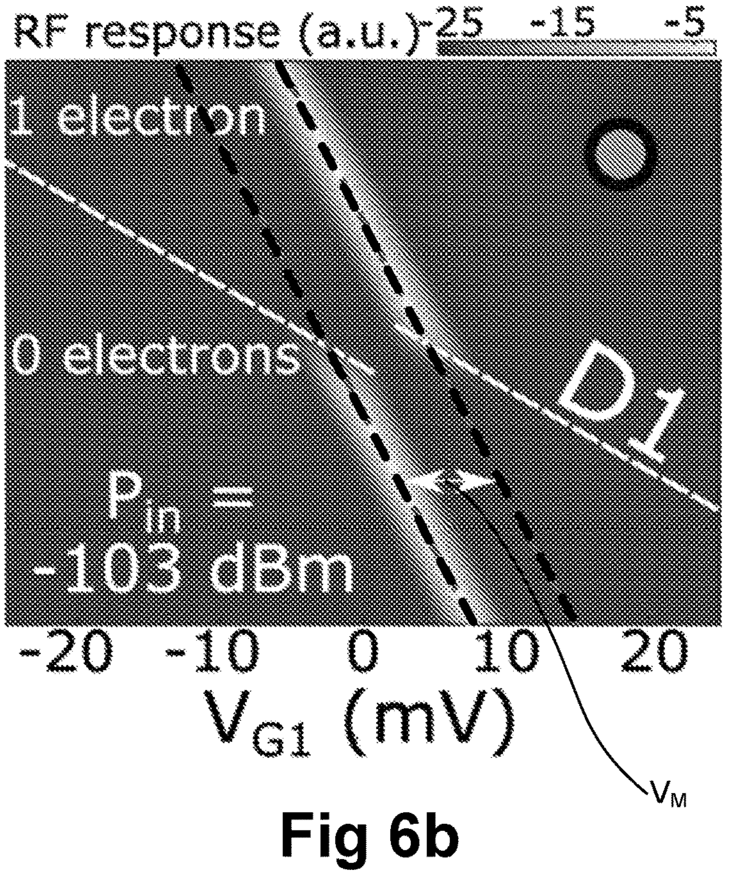
Figure 6C:
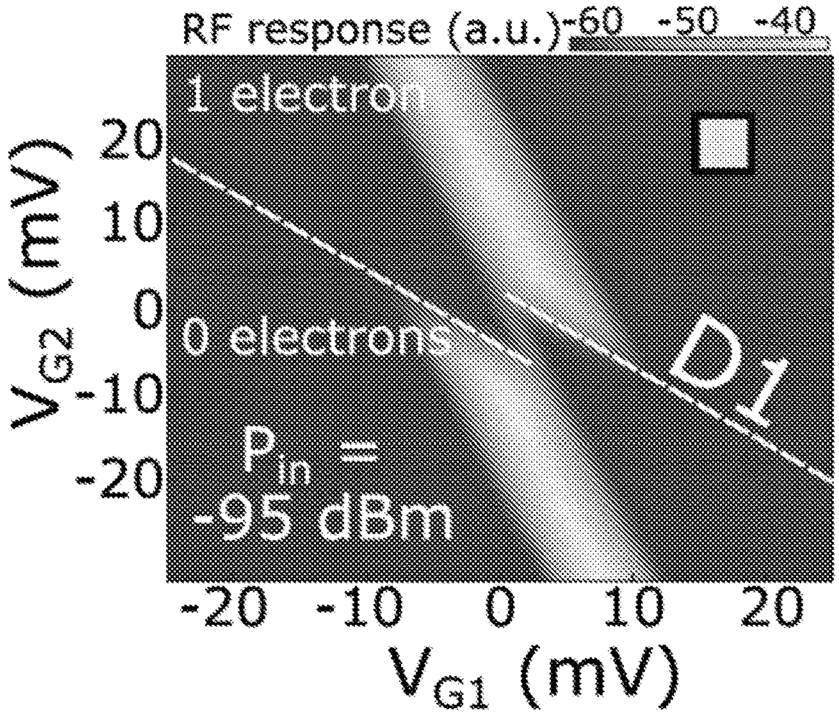
Figure 6D:
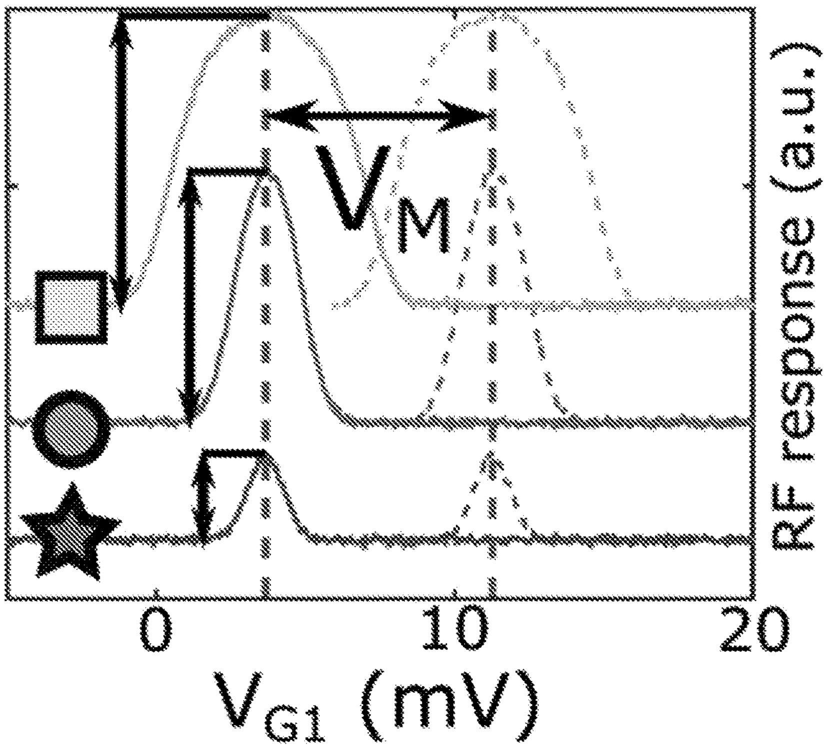
Figure 6E:
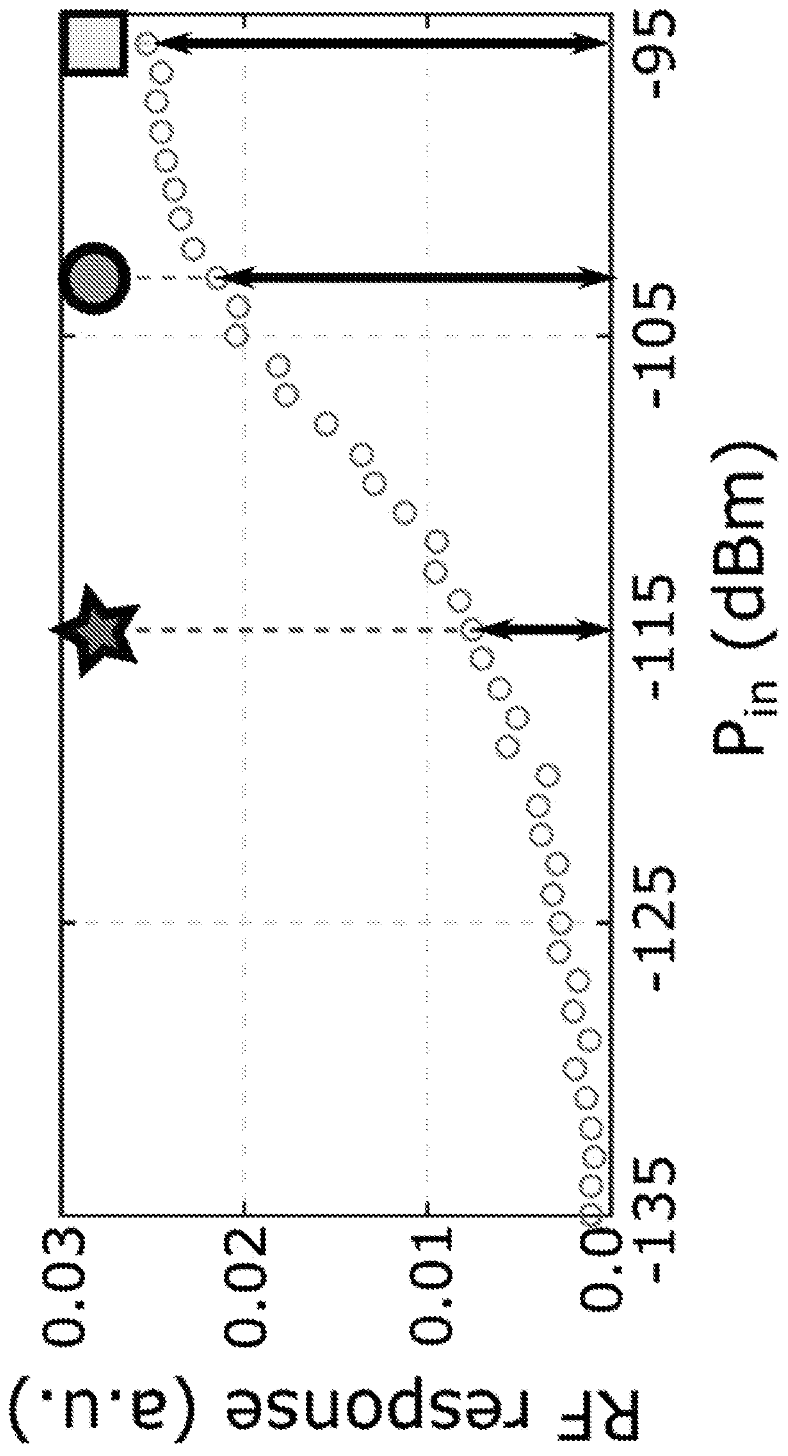
Figure 7A:
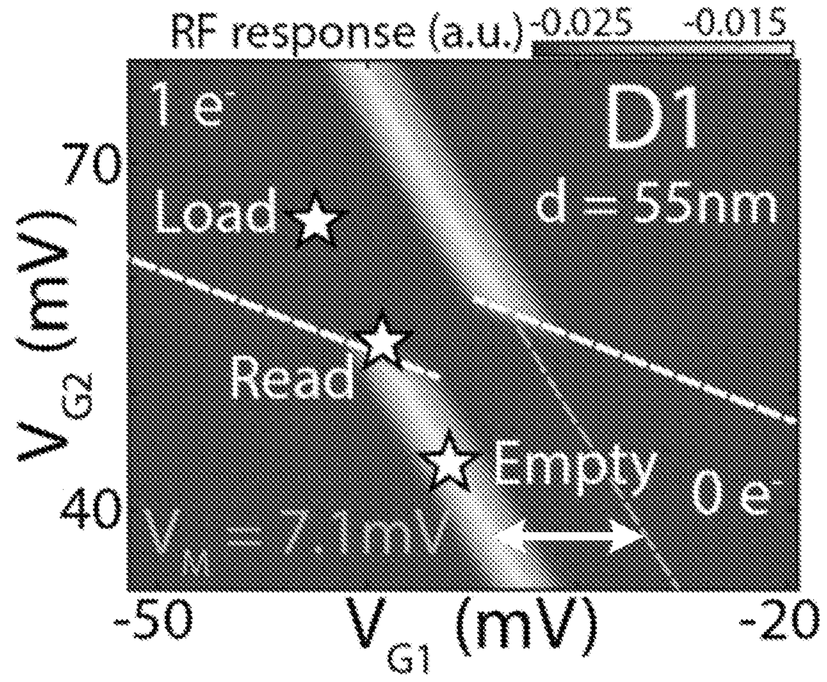
FIGS. 7(*a*)-7(*f*) show single-shot readout pulse positions and experimental traces for quantum dots D1, D2 and D3.
Figure 7B:
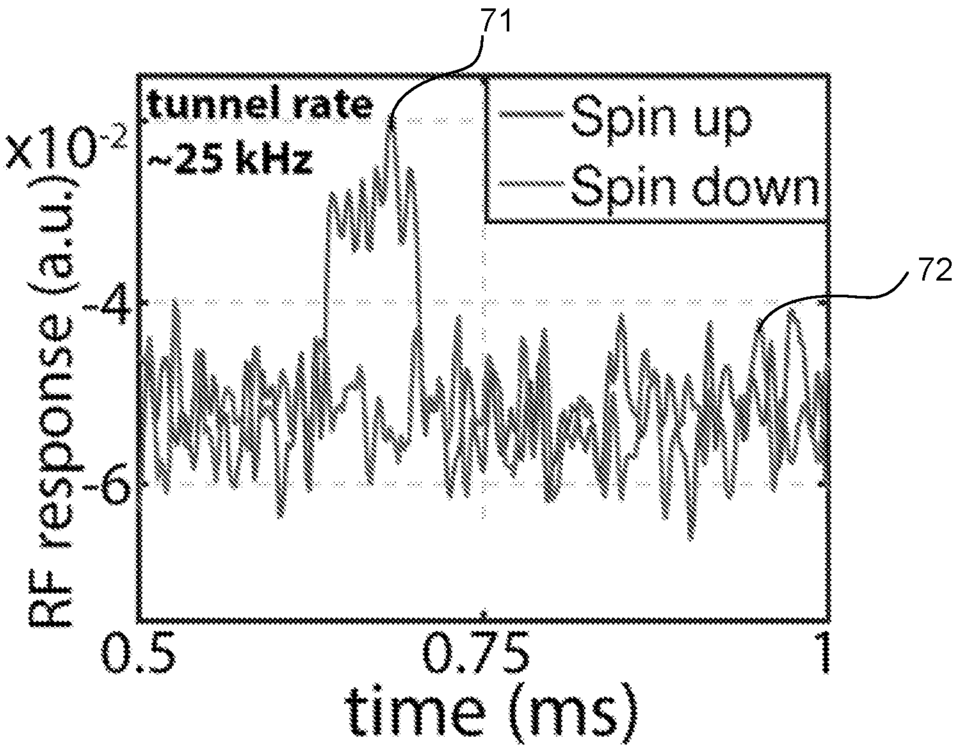
Figure 7C:
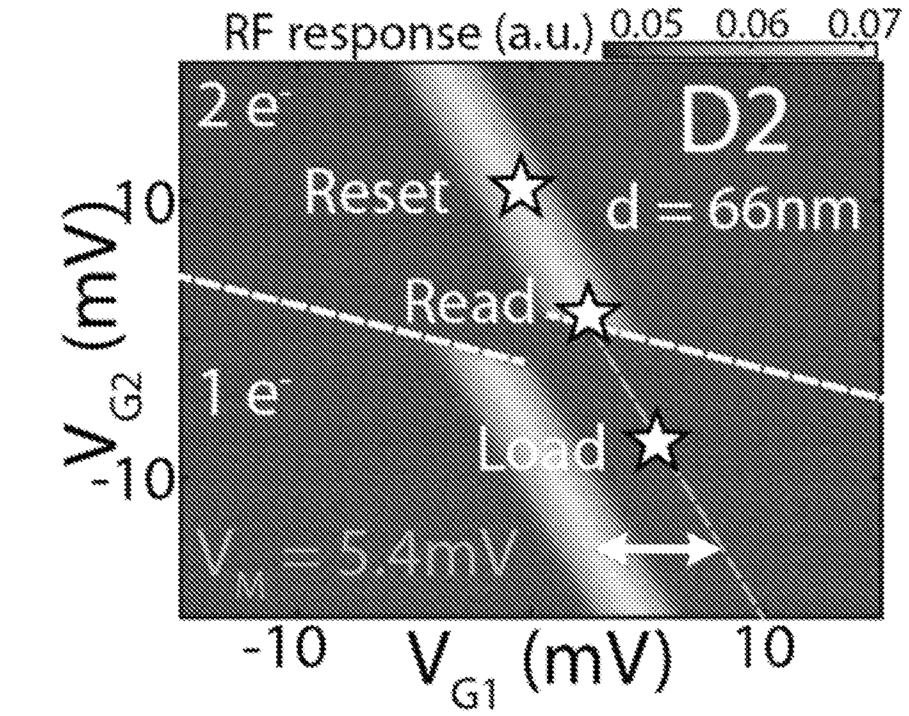
Figure 7D:
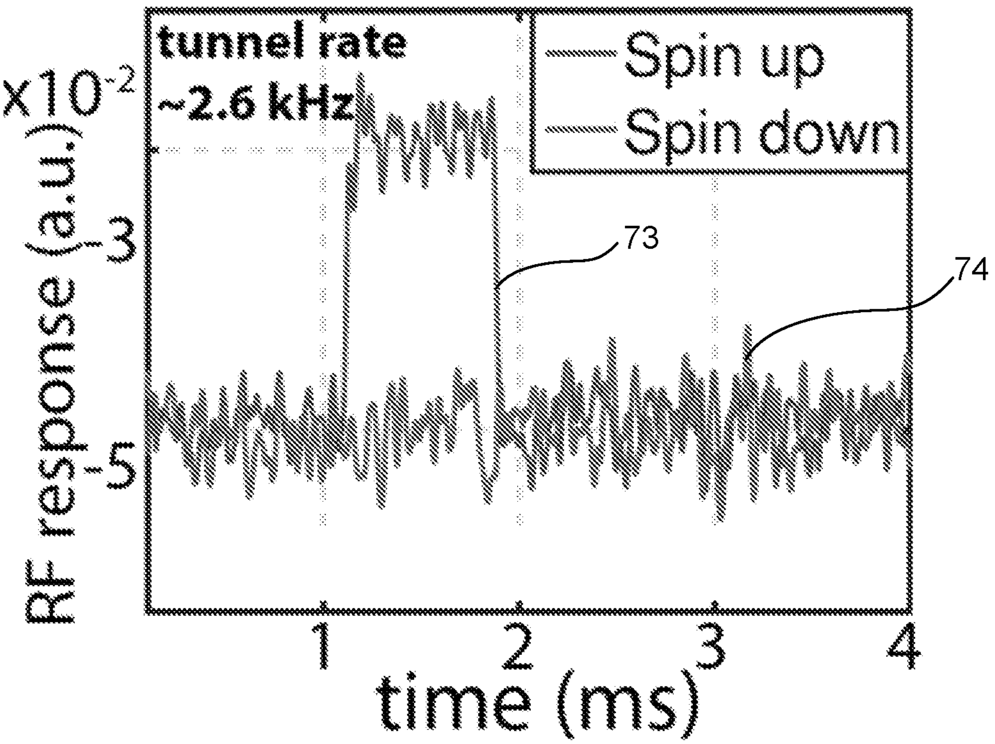
Figure 7E:
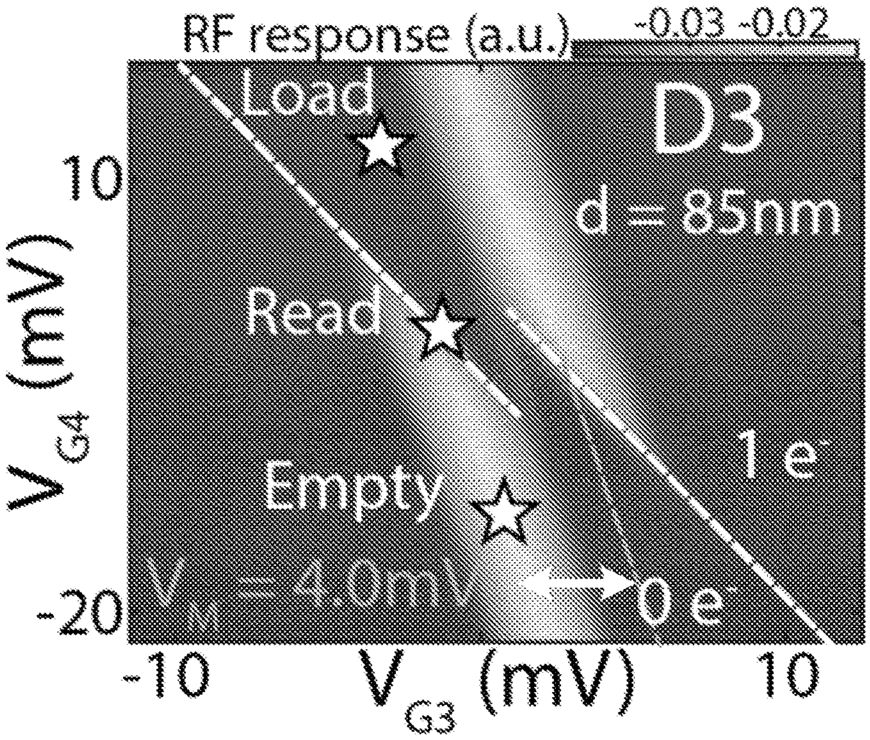
Figure 7F:
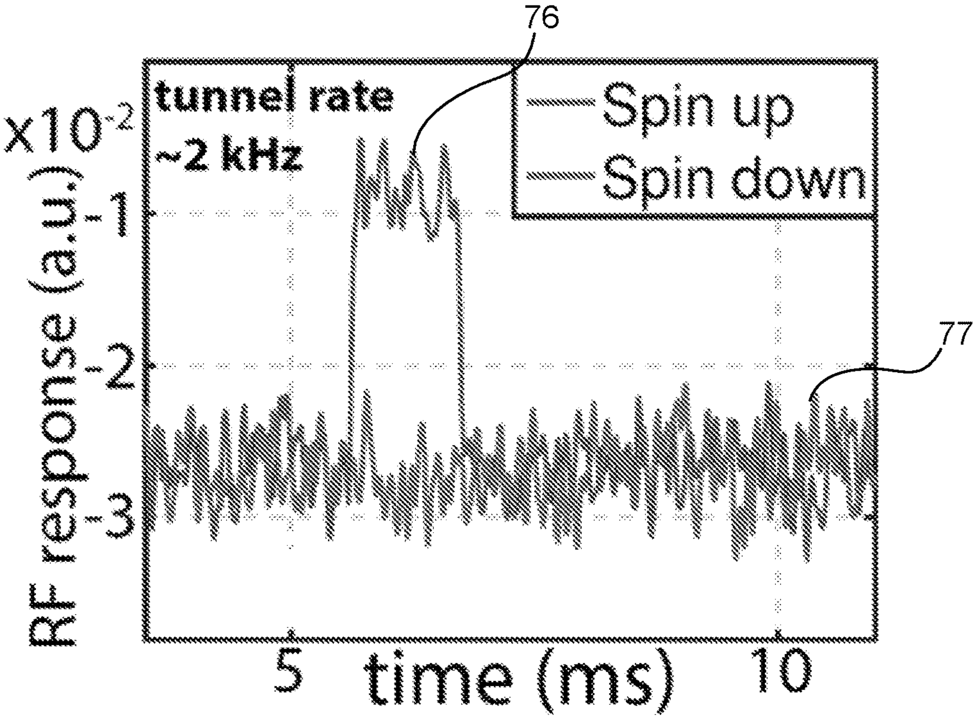
Figure 7G:
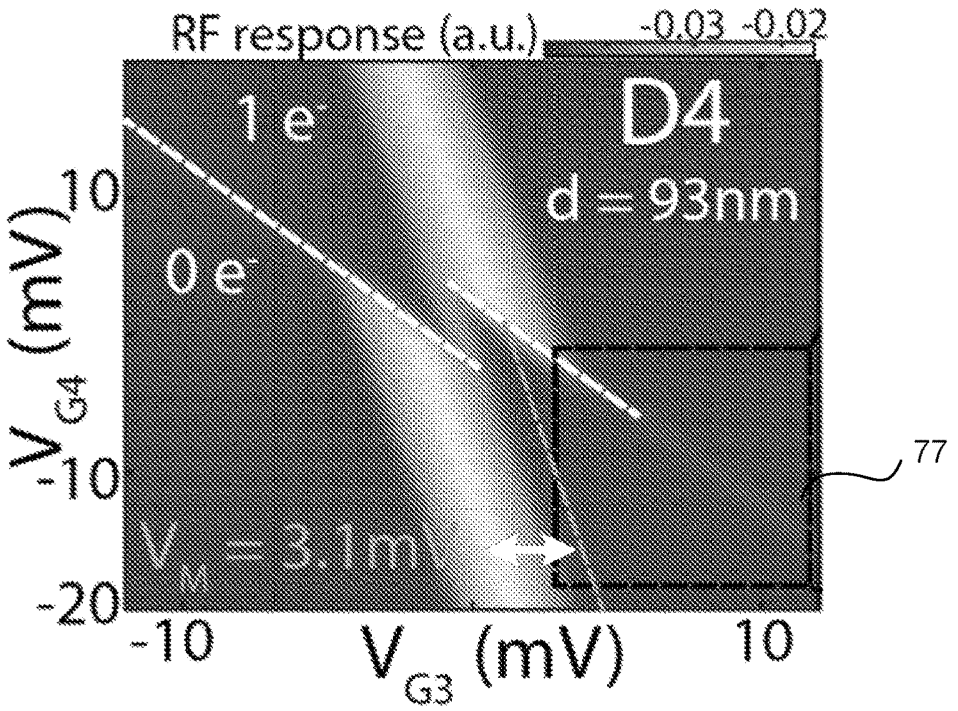
Figure 7H:
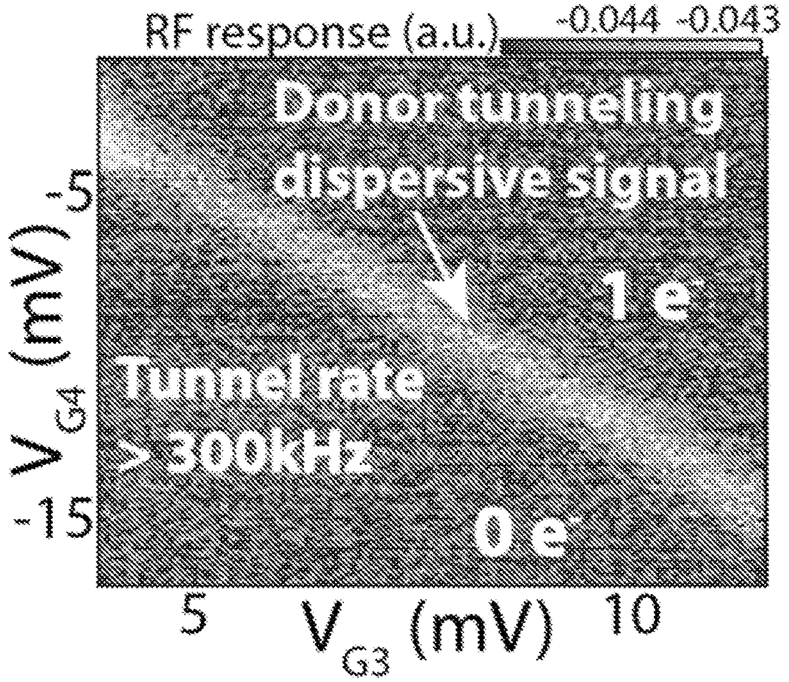
Figure 8A:
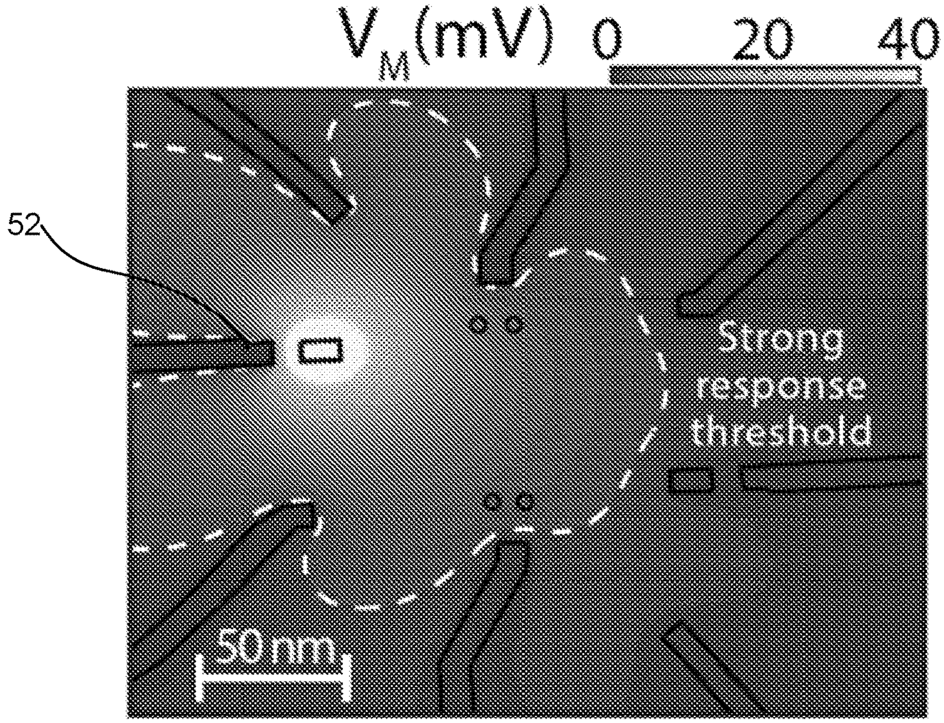
FIG. 8(*a*) shows simulation results showing an expected strong response regime in the vicinity of SLQD charge sensor.
Figure 8B:
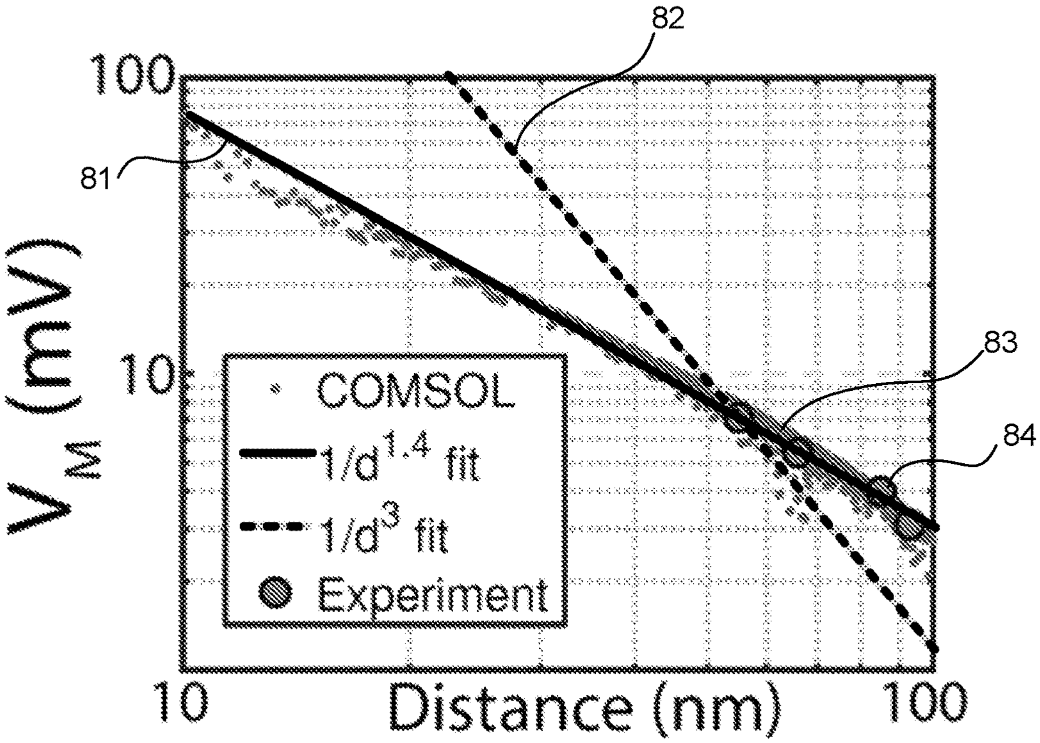
Figure 8C:
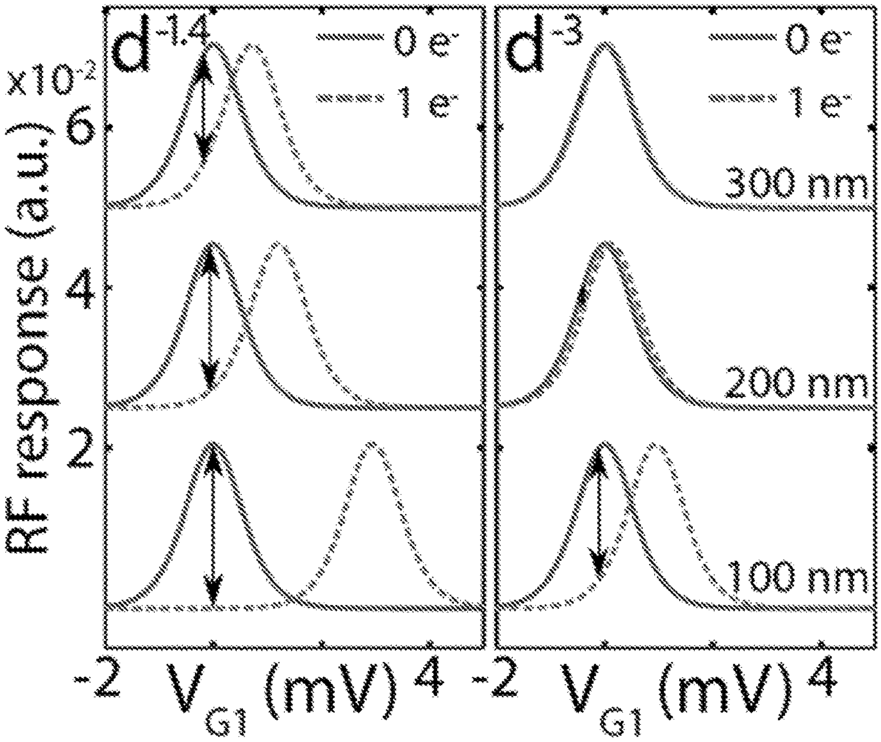
Figure 8D:
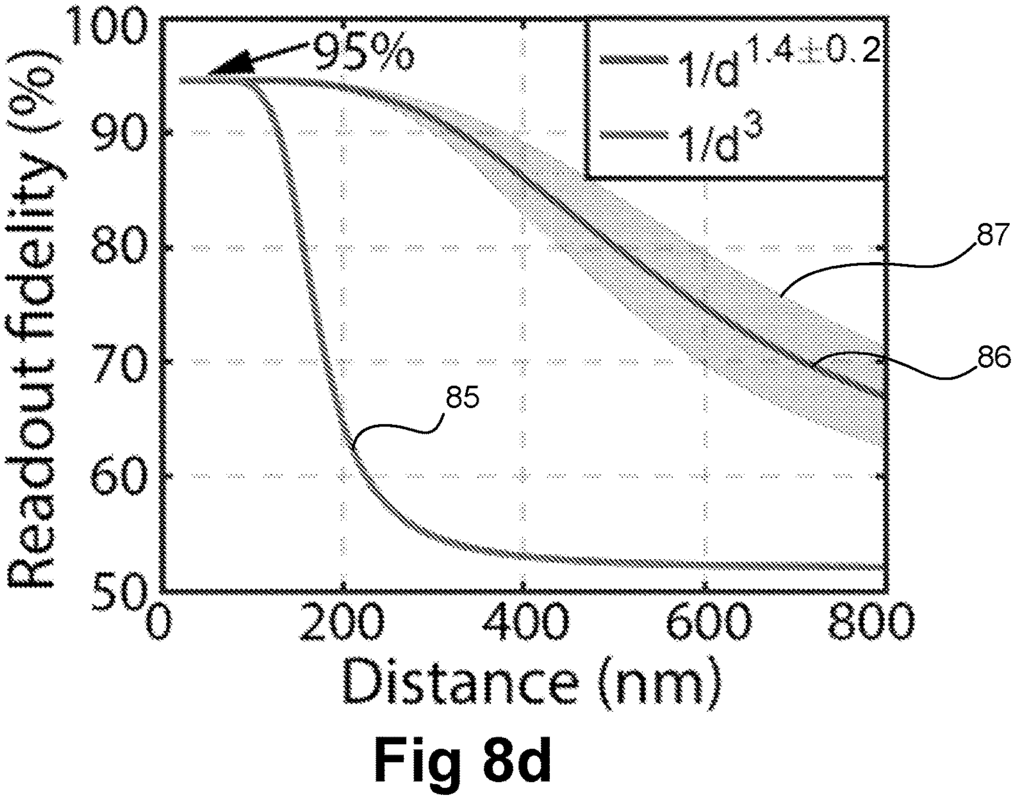

FIG. 5*d* shows a similar charge stability diagram for the bottom pair of donor quantum dots (D3, D4), sweeping $V_{L1}$ (voltage at single lead L1) and $V_{R2}$ (voltage at reservoir R2). The dotted lines indicate D3 charge transitions and the solid lines indicate D4 charge transitions, as labelled. Electron numbers are assigned by fully depleting the donors of electrons, then adding an electron each time a donor transition line is crossed. Sweeping R2 to negative voltages adds electrons to quantum dots D3 and D4. In contrast, gates G1-G4 are only capacitively coupled to the quantum dots (not tunnel-coupled) and sweeping gates G1-G4 to negative voltages typically remove electrons from the corresponding quantum dots D3-D4, respectively.

Optimising the SLQD Charge Sensor for Single-Electron Charge Detection

To optimise the SLQD charge sensor of device 50 for time-resolved charge detection of the electrons confined in the donor quantum dots, the main tuneable experimental parameter is the input reflectometry power $P_{in}$. In an SLQD charge sensor the sensor signal saturates as a function of $P_{in}$. This can be understood intuitively by considering the cyclical single-electron tunnelling process that generates the dispersive signal 53. When $P_{in}$ is large enough to fully traverse a Coulomb peak, a full electron is driven between L1 and SLQD 52 each time the reflectometry signal reverses polarity. Because there is no DC current path, the tunnelling current is limited to two electrons per AC cycle. The amplitude of the tunnelling current is thus constrained by Coulomb blockade. The measured signal is directly proportional to the tunnelling current in the device, hence this also saturates. In the current measurements, $P_{in}$ is selected to be at the onset of this signal saturation for providing an optimal readout of the SLQD charge sensor.

FIGS. 6(*a*)-6(*c*) show charge sensing response of the SLQD charge sensor for the first charge transition of D1 as a function of gate voltages and input power $P_{in}$ levels. FIG. 6(*a*) has $P_{in}$=−115 dBm that is below the saturation level. FIG. 6(*b*) has $P_{in}$=−103 dBm that is at the onset of power saturation. FIG. 6(*c*) has $P_{in}$=−95 dBm that is well into saturation. Beyond the saturation point increasing the input power does not return significantly more signal, and the Coulomb peaks start to power broaden. To sense the donor quantum dot electrons, $P_{in}$ value at the onset of saturation is selected (i.e. $P_{in}$=−103 dBm), which gives an optimal balance between signal contrast and Coulomb peak power broadening.

FIG. 6(*d*) demonstrates the shift in the SLQD sensor response ($V_M$) due to an electron charging event on quantum dot D1. The size of this shift depends on the capacitive coupling between the SLQD sensor and the target qubit. For D1, $V_M$=7.1 mV.

Furthermore, it is found that the size of $V_M$ as a function of distance d between the qubit and the SLQD charge sensor 52 is an important parameter that can be used to determine the density of SLQD charge sensors required in a quantum processing device having a given number of qubits. An architecture in which $V_M$ decreases slowly as a function of distance d can reduce the number of SLQD charge sensors required in the quantum processing device. It is noted that due to the strong capacitive coupling between the SLQD sensor and qubit D1, $V_M$ is larger than a Coulomb peak width for all $P_{in}$ values in FIG. 6*d*. In this situation the maximum signal contrast for sensing D1 is thus obtained by tuning to the top of a Coulomb peak, rather than the side of a peak which gives the best small-signal sensitivity. This is called the strong-response charge sensing regime and allows binary on-off switching of the full sensor signal during charge detection by the SLQD. In device 50, all four donor quantum dots D1-D4 are in the strong response regime for $P_{in}$=−103 dBm as shown in FIG. 6(*b*), hence the same value of $P_{in}$=−103 dBm is used to sense all four qubits.

FIG. 6(*e*) shows the maximum sensor contrast as a function of $P_{in}$, with the values from FIGS. 6(*a*), 6(*b*) and 6(*c*) indicated by the matching shapes start, circle and square, respectively. For $P_{in}$>−103 dBm the maximum signal saturates and going above this value causes to power broadening without significant gain in signal height. This further justifies the use of $P_{in}$=−103 dBm in the following experiments.

The maximum tunnelling current that can flow at the reflectometry frequency is given by—

$$|I_{max}|=|4(1-\alpha)ef|, \quad (1)$$

where α is the lever arm between lead 54 and SLQD sensor 52, e is the electron charge, and f is the frequency of the reflectometry signal. It should be noted the saturation value is 4αef when the reflectometry signal is applied to a gate that is not tunnel coupled to the SLQD dot.

For direct dispersive readouts, a single lead and two quantum dots are used. The differential lever arm Δα=(α1−α2) is the scale factor that converts between a voltage applied to the lead and the energy difference created between first and second dots (dot1 and dot2), where α1 is the lever arm between the lead and dot1, and α2 is the lever arm between the lead and dot2. For direct dispersion readouts, signal saturation also occurs to a value of 4Δαef. Lever arms are positive valued so α>Δα is always true for single-lead sensors, explaining why the SLQD charge sensor is capable of higher sensitivity than direct dispersive readout.

In typical STM devices, the SLQD charge sensor is close enough to its electron reservoir (e.g. single-lead 54 for SLQD sensor 52 in device 50) for tunnelling to occur, so (1−α)>Δα is true in realistic STM devices (for example, typical values are (1−α)~0.5, Δα~0.05). In CMOS nanowire devices a can be greater than 0.9, and Δα is approximately from 0.3 to 0.72. The quantum capacitance of an SLQD charge sensor ($Cq \propto \alpha^2$) is thus much larger than that of a direct dispersive sensor ($Cq \propto \Delta\alpha^2$), explaining the potential for higher sensitivity for charge detection in quantum processing devices. Equation 1 also shows that increasing the reflectometry frequency generates more signal, so operating at higher frequencies can improve the sensitivity.

Single-Shot Electron Spin Readout

With $P_{in}$ optimised, an SLQD charge sensor (such as sensor 52) can be ready for single-shot qubit readout (i.e., electron spin readout) in the single-spin basis. In an experiment, SLQD sensor 52 is used to perform single-shot electron spin readout in the single-spin basis for D1, D2 and D3. For donor dot D4 the tunnel rate to R2 exceeded measurement bandwidth and readout could not be performed.

FIG. 7 illustrates the results of this spin readout experiment with a particular set of settings. In particular, in this experiment, a magnetic field of 1.5 Tesla was applied to Zeeman split the electron spin states for D1-D3. In the case of each donor dot, a three-level pulse along the SLQD transition line was performed, with the levels indicated by stars in FIGS. 7 (*a*), 7(*c*) and 7(*e*). The 3-level pulse is essentially a voltage pulse having three constant voltage levels and the pulse may be abruptly switchable to one of these three voltage level. In particular, the three-level pulse sequence consists of a load phase to initialise a random electron spin state, followed by a read phase where the spin is projectively measured, and an empty phase to eject the electron before the next pulse repetition.

During the read phase a spin up state tunnels to a reservoir followed by a spin down tunnelling back to the donor dot, generating a characteristic "blip" in the charge sensor response which is absent for a spin down state. The pulse sequence for this experiment may be provided by an arbitrary waveform generator, with the waveform programmed via a computing or processing device. For example, the computing or processing device may be the "central control system".

The donor quantum dots D1, D2 and D3 are close enough to their respective reservoir R1/R2 to allow electron tunnelling between the dot and the respective reservoir. There is a potential barrier that electrons may overcome via quantum tunnelling to move between, e.g., D1 and R1, if an energy state is available. For spin readout, a spin-up electron has a higher energy and will tunnel through the potential barrier whereas a spin-down electron will not be able to tunnel.

For readout at the first electron transition if the electron is spin-up during the read phase it will tunnel off the donor, and a spin-down electron will tunnel back at some later time.

For $D^-$ readout if the electron is in spin-up state, a spin-down electron will tunnel in from the reservoir to form a two-electron singlet state, followed by a spin-up electron tunneling back to the reservoir. Both cases result in a spin-up electron being registered as a blip of increased signal during the readout phase. No electron tunneling occurs if the electron is in a spin-down state, hence no blip will be observed.

FIG. 7(*a*) shows a gate-gate map sweeping VG1 and VG2 over a single SLQD 52 line intersecting with the first electron charge transition of D1. Adding an electron to D1 shifts the SLQD 52 peak position by VM=7.1 mV (where $V_M$ is the mutual charging voltage in terms of $V_{G1}$). FIG. 7(*b*) shows example spin up 71 and spin down 72 traces for D1, demonstrating single-shot readout. The spin readout fidelity is calculated by taking 5000 individual single-shot traces and found to be FM=81%. The fidelity is limited by measurement bandwidth (which was set to ~80 kHz in this experiment), which was not high enough to capture the fastest tunnelling events. Increasing the measurement bandwidth permits faster events at the cost of reduced SNR (which also decreases the fidelity). 80 kHz was found to give the maximum fidelity of 81% in this experimental setup.

FIG. 7(*c*) shows a gate-gate map sweeping $V_{G1}$ and $V_{G2}$ over a single SLQD 52 line intersecting with the second electron charge transition of D2. D− charge readout was performed in this experiment due to the favourable electron tunnel rate at the second electron transition (~2.6 kHz). Example single-shot traces showing the difference between spin-up (signal 73) and spin-down (signal 74) signals are shown in FIG. 7(*d*). Taking 5000 individual traces, a fidelity of FM=95% was found for D2. This fidelity is again limited in part by the measurement bandwidth (which was 15 kHz in this experiment) filtering the fastest tunnelling events, as well as a relatively high electron temperature (~280 mK).

FIG. 7(*e*) shows a gate-gate map sweeping $V_{G1}$ and $V_{G2}$ over a single SLQD 52 line intersecting with the first electron charge transition of D3. In this case electrons tunnel between D3 and R2 (rather than R1 as in the previous cases) during spin readout. FIG. 7(*f*) shows corresponding example single-shot spin up 75 and spin down 76 traces for D3. The Fidelity in this case was calculated to be $F_M$=95%, which is limited by the same factors as D2.

FIG. 7(*g*) shows gate-gate voltage map for quantum dot D4. For this donor quantum dot D4, the tunnel rate between the donor and reservoir was too fast to perform single-shot spin readout. In fact, a faint signal can be observed due to cyclical driving of an electron between the D4 and R2. This implies that the tunnel rate is non-negligible compared to the RF reflectometry frequency (130 MHz). FIG. 7(*h*) shows a zoom in on region 77 region of FIG. 7(*g*), highlighting the faint signal due to the donor electron tunnelling. Due to the fast tunnel rate single-shot spin readout could not be performed on quantum dot D4.

Table I below shows a summary of the single-shot readout results for the four donor dots D1-D4.

TABLE I

Summary of single-shot readout results for four donor dot device.

| Donor number | | Readout transition electron # | Tunnel rate (kHz) | Distance to sensor (nm) | Sensor shift (mV) | Readout fidelity (%) | Measurement bandwidth (kHz) | Amplitude SNR | $\tau_{min}$ (ns) |
|---|---|---|---|---|---|---|---|---|---|
| D1 | 2P | 0↔1 | ~25 | 55 | 7.1 | 81 | 80 | 4.0 | 780 |
| D2 | 3P | 1↔2 | ~2.6 | 66 | 5.4 | 95 | 15 | 9.6 | 720 |
| D3 | 3P | 0↔1 | ~2.0 | 85 | 4.0 | 95 | 15 | 8.1 | 1020 |
| D4 | 1P | 0↔1 | >300 | 93 | 3.1 | N/A | N/A | N/A | N/A |

Long-Range Charge Sensing

This section describes the investigation of scaling of the sensor shift $V_M$ as a function of the sensor-qubit distance d. First, the capacitive coupling between SLQD sensor 52 and the qubits in device 50 was simulated using the finite element package COMSOL Multiphysics. The simulation result is plotted in FIG. 8(*a*), with the dotted contour indicating the region within which $V_M$ is large enough to shift the SLQD 52 Coulomb peak from full signal (on top of the peak) to <1% signal due to a charging event on the target qubit (the strong response threshold). The strong response regime is defined as the region within which >99% of the full on-off signal contrast is possible. Beyond this strong response boundary, the maximum readout contrast is achieved by reducing $P_{in}$, biasing to the side of a Coulomb peak, or both. Any qubit located inside the footprint of this contour line 82 would generate full on-off switching of the sensor signal, and could be measured without any loss of fidelity due to the distance from the sensor.

FIG. 8(*b*) shows plots for shift in the SLQD sensor response ($V_M$) as a function of the distance d from the center of the SLQD sensor for the device region containing the sensor and patterned qubits. Fitting to the simulated $V_M$ values (blue dots 83), it was found that $V_M$ is directly proportional to $d^{1.4\pm0.1}$ which is consistent with the actual measured data using the device 50 (shown by circles 84). Both the experimental and simulated results are incompatible with a $1/d^3$ scaling, indicated by the curve 81 in FIG. 8 (*b*).

FIG. 8(*c*) highlights the impact of this difference in scaling for long-range charge sensing. The left panel uses the $1/d^{1.4}$ fit from FIG. 8(*b*) to estimate $V_M$ at distances of 100, 200 and 300 nm from the SLQD sensor 52. The solid and dotted lines show the expected position of the SLQD Coulomb peak for 0 electrons and 1 electron, respectively, on the target qubit at the specified distance. The shape of the sensor Coulomb peak is determined by fitting to a line of the experimental data in FIG. 6(*b*) for the optimal $P_{in}$ value (i.e. −103 dBm). The arrows in FIG. 8*c* indicate the maximum sensor contrast for detecting the electron charge on the target. The right panel shows the RF response using the $1/d^3$ fit (81) from FIG. 8(*b*) to estimate $V_M$ for 100, 200 and 300 nm from the sensor. In this case $V_M$ decreases more rapidly with distance, and the contrast is minimal at 300 nm.

To highlight the importance of this scaling for scalable quantum computing, the expected single shot readout fidelity as a function of d is calculated for a qubit with the same parameters as dot D3 in device 50. From the fit in FIG. 8(*b*) $V_M$ as a function of d is estimated and used to calculate the expected signal contrast. Following this, the signal to noise ratio (SNR) is calculated using the noise measured in the experiment and which then is used for fidelity calculation.

FIG. 8(*d*) shows the result for both $1/d^{1.4\pm0.1}$ and $1/d^3$. The curve 86 corresponds to the results for $1/d^{1.4\pm0.1}$, with the shaded region 87 outlining the uncertainty bounds. The curve 85 corresponds to the results for $1/d^3$, and exhibits a faster roll off in readout fidelity. For small d the sensor is in the strong response regime and has full on-off signal contrast and both curves saturate to 95% fidelity, as observed in the direct measurements of D3. As evident from this figure, a qubit with the same properties as D3 (i.e., donor based qubit with low metal gate accumulation) could be measured with over 90% spin readout fidelity up to 300 nm from an SLQD sensor, compared to 130 nm for a $1/d^3$ scaling as observed in accumulation-mode gate-defined devices.

Furthermore, it is found that for a linear array of tunnel-coupled donor qubits with a typical separation distance of 12 nm between the adjacent qubits, a single SQLD placed in the center of the linear array can read out up to 50 qubits similar to D3 (i.e. donor based qubit with low metal gate accumulation) with over 90% fidelity. This can be increased to >99% by optimising the measurement setup to reduce the electron temperature, operating the SLQD at higher frequencies and using a quantum limited Josephson parametric amplifier. The equivalent number of qubits for an accumulation-mode gate-defined device (assuming a qubit separation of 80 nm and sensing range of 130 nm) is roughly 3. This is consistent with currently available experimental gate-defined arrays having 3-4 qubits per sensor.

In this experiment, the relaxation time Ti has been measured as 11 seconds for D3 at 1.5 Tesla. Further, up to 30 seconds has been demonstrated in other experiments for donor qubits. Given the extremely long relaxation times Ti in donor qubits and recent advances navigating charge states in large qubit arrays, 50 qubits can be measured sequentially by the same SLQD charge sensor without limiting the fidelity.

The above experiments results shows that the capacitive coupling between sensor and qubits follows a $1/d^{1.4\pm0.1}$ dependence when used for donor type qubits and single-shot SLQD charge sensor, in contrast to previous measurements in linear arrays of accumulation mode gate-defined devices which observed a $1/d^3$ dependence. This difference in scaling has a significant impact for long range qubit readout in future quantum processing devices where scalability is an important consideration. The advantageous distance scaling in the low metal gate density device 50 implies that the number of sensors per qubit can be significantly reduced in future large-scale quantum processing devices. Crystalline donor qubits thus have a dual advantage—a) qubits can be sensed from further away, and b) qubits can be fabricated with higher density due to the atomic-scale lithography resolution. These results are very promising for realising large-scale quantum computing architectures with dramatically reduced sensor densities in atom-scale qubits.

The small footprint and high sensitivity of the SLQD coupled with the favourable distancing sensing makes the SLQD a promising sensor for scaling up donor-based atom qubits in large scale quantum processing devices.

The term "comprising" (and its grammatical variations) as used herein are used in the inclusive sense of "having" or "including" and not in the sense of "consisting only of".

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A quantum processing system, comprising:

a plurality of qubits positioned in a semiconductor substrate, each qubit being based on a spin state of an individual quantum dot embedded in the semiconductor substrate and each individual quantum dot consisting of one or more donor atoms;

a single lead quantum dot (SLQD) charge sensor fabricated in the semiconductor substrate; and a plurality of control gates configured to control the plurality of qubits;

wherein the SLQD charge sensor is configured to sense two or more qubits which are positioned within a sensing range of the SLQD charge sensor.

2. The quantum processing system of claim 1, wherein a capacitive charge coupling between the SLQD charge sensor and the two or more qubits provides the SLQD charge sensor with a sensing range of up to 300 nanometers.

3. The quantum processing system of claim 1, wherein an inter-qubit distance between two adjacent qubits is 5-45 nanometers.

4. The quantum processing system of claim 1, wherein each of the plurality of control gates is positioned in a plane that is same as a plane in which the plurality of qubits and the SLQD charge sensor are positioned.

5. The quantum processing system of claim 1, wherein the plurality of qubits are arranged in a one-dimensional linear array and the SLQD charge sensor is positioned substantially at a center of the one-dimensional linear array for sensing the qubits.

6. The quantum processing system of claim 5, wherein the SLQD charge sensor senses four or more qubits in the one-dimensional linear array.

7. The quantum processing system of claim 5, wherein the SLQD charge sensor senses up to fifty qubits in the one-dimensional linear array.

8. The quantum processing system of claim 1, wherein the plurality of qubits are arranged in a two-dimensional arrangement and the SLQD charge sensor is placed substantially at a center of the two-dimensional arrangement.

9. The quantum processing system of claim 8, wherein the plurality of qubits arranged in the two-dimensional arrangement is up to 200 qubits.

10. The quantum processing system of claim 1, wherein the SLQD charge sensor senses the spin-states of each qubit using single-shot read out process.

11. The quantum processing system of claim 1, wherein:

the sensing range of the SLQD charge sensor is directly proportional to capacitive coupling between the SLQD and donor-based qubits, and the capacitive coupling is directly proportional to $1/d^{1.4:0.1}$, wherein d is the distance between the SLQD charge sensor and qubit.

12. The quantum processing system of claim 1, wherein the SLQD charge sensor sequentially reads out spin-states of the two or more qubits.

13. The quantum processing system of claim 1, wherein the donor atoms are Phosphorus-31 ($^{31}P$) donor atoms.

14. The quantum processing system of claim 13, wherein $^{31}p$ donor quantum dots are fabricated in silicon using a scanning tunnelling microscope to conduct atomic precision hydrogen resist lithography.

15. A method of manufacturing a quantum processing system comprising the steps of:

providing a plurality of qubits positioned in a semiconductor substrate, each qubit being based on a spin state of an individual quantum dot embedded in the semiconductor substrate and each individual quantum dot comprising one or more donor atoms;

providing a single lead quantum dot (SLQD) charge sensor in a semiconductor substrate; and providing a plurality of control gates configured to control the plurality of qubits;

wherein the SLQD charge sensor is configured to measure two or more qubits, which are positioned within a sensing range of the SLQD charge sensor.

16. The method of claim 15, wherein the donor atoms are Phosphorus-31 ($^{31}P$) donor atoms.

17. The method of claim 16, further comprising fabricating the $^{31}P$ donor quantum dots in silicon using a scanning tunnelling microscope to conduct atomic precision hydrogen resist lithography.

18. The method of claim 15, wherein providing the plurality of qubits comprises maintaining an inter-qubit distance between two adjacent qubits between 5-45 nanometers.

19. The method of claim 15, wherein:

providing the plurality of qubits comprises arranging the plurality of qubits in a one-dimensional linear array; and providing the SLQD charge sensor comprises positioning the SLQD sensor substantially at a center of the one-dimensional linear array.

20. The method of claim 15, wherein:

providing the plurality of qubits comprises arranging the plurality of qubits in a two-dimensional arrangement; and providing the SLQD charge sensor comprises positioning the SLQD sensor substantially at a center of the two-dimensional arrangement.

* * * * *